United States Patent
Kong et al.

(10) Patent No.: US 12,349,483 B2
(45) Date of Patent: Jul. 1, 2025

(54) DETECTION SUBSTRATE AND DETECTION APPARATUS

(71) Applicants: Beijing BOE Sensor Technology Co., Ltd., Beijing (CN); BOE Technology Group Co., Ltd., Beijing (CN)

(72) Inventors: Dexi Kong, Beijing (CN); Shoujin Cai, Beijing (CN); Cheng Li, Beijing (CN); Jie Zhang, Beijing (CN); Jin Cheng, Beijing (CN); Ziran Liu, Beijing (CN); Tiansheng Li, Beijing (CN)

(73) Assignees: Beijing BOE Sensor Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/579,364

(22) PCT Filed: Jul. 27, 2022

(86) PCT No.: PCT/CN2022/108150
§ 371 (c)(1),
(2) Date: Jan. 14, 2024

(87) PCT Pub. No.: WO2023/020218
PCT Pub. Date: Feb. 23, 2023

(65) Prior Publication Data
US 2024/0347555 A1 Oct. 17, 2024

(30) Foreign Application Priority Data
Aug. 18, 2021 (CN) .......................... 202110946564.4

(51) Int. Cl.
*H10F 39/00* (2025.01)
(52) U.S. Cl.
CPC ....... *H10F 39/802* (2025.01); *H10F 39/8037* (2025.01); *H10F 39/811* (2025.01)

(58) Field of Classification Search
CPC ......... H01L 27/14603; H01L 27/14612; H01L 27/14636; H10F 39/12
See application file for complete search history.

(56) References Cited

U.S. PATENT DOCUMENTS

2018/0019288 A1* 1/2018 Yang ..................... H10K 59/40
2019/0326376 A1 10/2019 Huo
(Continued)

FOREIGN PATENT DOCUMENTS

CN 109713162 A 5/2019
CN 110707134 A 1/2020
(Continued)

OTHER PUBLICATIONS

PCT/CN2022/108150 international search report dated Sep. 29, 2022.

*Primary Examiner* — Thanh Luu
*Assistant Examiner* — Mai Thi Ngoc Tran
(74) *Attorney, Agent, or Firm* — IPro, PLLC

(57) ABSTRACT

Disclosed are a detection substrate and a detection apparatus. The detection substrate includes: a base substrate; a plurality of pixel drive circuits; a first insulating layer, where the first insulating layer includes a plurality of first through holes; and a plurality of photosensitive devices, where each photosensitive device includes a first electrode, a photoelectric conversion layer and a second electrode, which are arranged in a stacked manner, the first electrode includes a body portion for carrying the photoelectric conversion layer, and a protruding portion, which extends from the body portion to cover the first through hole, the protruding portion is electrically connected to the pixel drive circuit by means of the first through hole, and an orthographic projection of the photoelectric conversion layer on the base substrate and (Continued)

an orthographic projection of the first through hole on the base substrate are provided side by side.

19 Claims, 22 Drawing Sheets

(56) References Cited

U.S. PATENT DOCUMENTS

| | | | |
|---|---|---|---|
| 2019/0332841 A1* | 10/2019 | Zhou | G06V 40/1306 |
| 2020/0052241 A1* | 2/2020 | Li | H10K 59/38 |
| 2022/0019755 A1 | 1/2022 | Niu et al. | |
| 2022/0130919 A1 | 4/2022 | Zhang et al. | |
| 2022/0131077 A1 | 4/2022 | Gao et al. | |
| 2022/0320219 A1 | 10/2022 | Zheng | |

FOREIGN PATENT DOCUMENTS

| | | |
|---|---|---|
| CN | 111341814 A | 6/2020 |
| CN | 111708203 A | 9/2020 |
| CN | 112186026 A | 1/2021 |
| CN | 112285996 A | 1/2021 |

* cited by examiner

DETECTION SUBSTRATE AND DETECTION APPARATUS

CROSS REFERENCES TO RELATED APPLICATIONS

The present disclosure is a National Stage of International Application No. PCT/CN2022/108150, filed Jul. 27, 2022, which claims the priority to Chinese patent application No. 202110946564.4 filed to China National Intellectual Property Administration on Aug. 18, 2021 and entitled "Detection Substrate and Detection Apparatus", of which the entire contents are incorporated herein by reference.

TECHNICAL FIELD

The present disclosure relates to the technical field of the optical detection, in particular to a detection substrate and detection apparatus.

BACKGROUND

With the rapid development of the communication, network, and financial technology, the information security has shown unprecedented importance, and the application of human identification technology has become more and more extensive. The biometric technology refers to the science and technology that uses physiological characteristics (e.g., face, fingerprint, palm-print) or behavioral characteristics to automatically identify an individual's identity. Fingerprint is one of the most widely used physiological characteristics, and Because of its uniqueness and permanence, it has attracted people's attention and has a very wide application prospect in many aspects of the security field. The fingerprint automatic recognition system has been successfully applied in the prevention for identity fraud, the combating terrorism, the criminal investigation and the national defense security. Therefore, the fingerprint sensor has broad application prospects.

SUMMARY

The detection substrate and the detection apparatus provided by the embodiments of the present disclosure have specific solutions as follows.

In one aspect, embodiments of the present disclosure provide a detection substrate, including:
  a base substrate;
  a plurality of pixel drive circuits on the base substrate;
  a first insulating layer on a side of a layer where the plurality of pixel drive circuits are located facing away from the base substrate, where the first insulating layer includes a plurality of first through holes; and
  a plurality of photosensitive devices on a side of the first insulating layer facing away from the layer where the plurality of pixel drive circuits are located;
  where each of the plurality of photosensitive devices includes a first electrode, a photoelectric conversion layer and a second electrode stacked;
  the first electrode includes a main portion carrying the photoelectric conversion layer and a protrusion portion extending from one side of the main portion to cover a first through hole;
  the protrusion portion is electrically connected with the pixel drive circuit through the first through hole; and
  an orthographic projection of the photoelectric conversion layer on the base substrate and an orthographic projection of the first through hole on the base substrate are arranged side by side.

In some embodiments, the detection substrate provided by the embodiments of the present disclosure further includes: a plurality of gate lines and a plurality of data lines, where the plurality of gate lines and the plurality of data lines intersect to define a plurality of pixel regions; and
  each of the pixel regions is arranged one-to-one corresponding with the first through hole; and one pixel drive circuit and one photosensitive device are electrically connected through the first through hole, and the orthographic projection of the first through hole on the base substrate and the orthographic projection of the photoelectric conversion layer on the base substrate are arranged side by side in a direction of the plurality of gate lines extension.

In some embodiments, in the detection substrate provided by the embodiments of the present disclosure, the orthographic projection of the first through hole on the base substrate is in a pixel region corresponding to the first through hole; and
  the orthographic projection of the photoelectric conversion layer on the base substrate extends into an adjacent pixel region in the direction of the plurality of gate lines extension.

In some embodiments, in the detection substrate provided by the embodiments of the present disclosure, the pixel drive circuit includes a read transistor electrically connected with one of the plurality of gate lines and one of the plurality of data lines, respectively; and
  the orthographic projection of the photoelectric conversion layer on the base substrate partially overlaps with an orthographic projection of a first terminal of a read transistor, which is in the adjacent pixel region, on the base substrate;
  where the first terminal of the read transistor is electrically connected with the data line.

In some embodiments, in the detection substrate provided by the embodiments of the present disclosure, an orthographic projection of an extension line of a side edge of the main portion away from the protrusion portion on the base substrate substantially coincides with an orthographic projection of an edge of a gate electrode of the read transistor, which is in the adjacent pixel region and close to the main portion, on the base substrate.

In some embodiments, in the detection substrate provided by the embodiments of the present disclosure, the pixel drive circuit further includes an amplifying transistor, and the amplifying transistor is electrically connected with the read transistor and the first electrode respectively;
  an orthographic projection of the amplifying transistor on the base substrate is on a side of the read transistor away from the data line with which the read transistor is electrically connected; and
  the orthographic projection of the photoelectric conversion layer on the base substrate partially overlaps with an orthographic projection of a gate electrode of the amplifying transistor, which is in a same pixel region as the photoelectric conversion layer, on the base substrate.

In some embodiments, in the detection substrate provided by the embodiments of the present disclosure, in the same pixel region, the orthographic projection of the first through hole on the base substrate is at a diagonal line, away from the read transistor, of the pixel region.

In some embodiments, in the detection substrate provided by the embodiments of the present disclosure, the read transistor includes two gate electrodes; and in the same pixel region, an orthographic projection of an extension line of a side edge of the protrusion portion away from the main portion on the base substrate is between the two gate electrodes of the read transistor.

In some embodiments, in the detection substrate provided by the embodiments of the present disclosure, an orthographic projection of a boundary line between the main portion and the protrusion portion on the base substrate and an orthographic projection of the gate electrode of the amplifying transistor on the base substrate have an overlapping area; and an overlapping width of the orthographic projection of the main portion on the base substrate and the orthographic projection of the gate electrode of the amplifying transistor on the base substrate in the direction of the plurality of gate lines extension, is larger than an overlapping width of the orthographic projection of the photoelectric conversion layer on the base substrate and the orthographic projection of the gate electrode of the amplifying transistor on the base substrate in the direction of the plurality of gate lines extension.

In some embodiments, in the detection substrate provided by the embodiments of the present disclosure, the pixel drive circuit further includes a connection electrode and a reset transistor, where the reset transistor is electrically connected with the amplifying transistor through the connection electrode; and an orthographic projection of a connection position between the connection electrode and the reset transistor on the base substrate is on a side of the first through hole away from the photoelectric conversion layer.

In some embodiments, in the detection substrate provided by the embodiments of the present disclosure, in a same pixel region, the orthographic projection of the first through hole on the base substrate and the orthographic projection of the photoelectric conversion layer on the base substrate are arranged side by side.

In some embodiments, the detection substrate provided by the embodiments of the present disclosure further includes:
a plurality of power supply lines extending in a same direction as the data lines;
where the power supply line is electrically connected with the pixel drive circuit;
the power supply line is adjacent to a data line electrically connected with a pixel drive circuit in an adjacent pixel region;
the orthographic projection of the photoelectric conversion layer on the base substrate and an orthographic projection of the power supply line on the base substrate have an overlapping area; and
the orthographic projection of the photoelectric conversion layer on the base substrate does not overlap with an orthographic projection of the data line, which is electrically connected with the pixel drive circuit in the adjacent pixel region, on the base substrate.

In some embodiments, in the detection substrate provided by the embodiments of the present disclosure, an orthographic projection of the main portion on the base substrate partially overlaps with the orthographic projection of the data line, which is electrically connected with the pixel drive circuit in the adjacent pixel region, on the base substrate.

In some embodiments, in the detection substrate provided by the embodiments of the present disclosure, the pixel drive circuit includes a read transistor electrically connected with one of the plurality of gate lines and one of the plurality of data lines, respectively; and an amplifying transistor electrically connected with the read transistor, the first electrode and the power supply line, respectively;

an orthographic projection of the amplifying transistor on the base substrate is on a side of the read transistor away from the data line with which the read transistor is electrically connected; and an orthographic projection of an extension line of a side edge of the photoelectric conversion layer adjacent to the protruding portion on the base substrate is between the read transistor and the amplifying transistor.

In some embodiments, in the detection substrate provided by the embodiments of the present disclosure, in a same pixel region, the orthographic projection of the first through hole on the base substrate is in a region enclosed by the data line, a diagonal line of the pixel region and the read transistor.

In some embodiments, in the detection substrate provided by the embodiments of the present disclosure, in a same pixel region, an orthographic projection of an extension line of a side edge of the protrusion portion away from the main part on the base substrate and an orthographic projection of a first terminal of the read transistor on the base substrate have an overlapping region, and the first terminal of the read transistor is electrically connected with the data line.

In some embodiments, in the detection substrate provided by the embodiments of the present disclosure, in a same pixel region, an orthographic projection of a boundary line between the main portion and the protrusion portion on the base substrate substantially coincides with an edge, which is adjacent to the amplifying transistor, of a gate electrode of the read transistor.

In some embodiments, in the detection substrate provided by the embodiments of the present disclosure, the pixel drive circuit further includes a connection electrode and a reset transistor, where the reset transistor is electrically connected with the amplifying transistor through the connection electrode; and an orthographic projection of a connection position between the connection electrode and the reset transistor on the base substrate is on a side of the first through hole close to the photoelectric conversion layer.

In some embodiments, in the detection substrate provided by the embodiments of the present disclosure, the first insulating layer includes a first planarization layer and a first protective layer stacked; and the first through hole includes a first through sub-hole in the first planarization layer, and a second through sub-hole in the first protective layer, where the first through sub-hole and the second through sub-hole are arranged through with each other, and an orthographic projection of the second through sub-hole on the base substrate is located in an orthographic projection of the first through sub-holes on the base substrate.

In some embodiments, in the detection substrate provided by the embodiments of the present disclosure, in the direction of the plurality of gate lines extension, pixel regions which are adjacent to each other share a data line; and in a direction of the plurality of data lines extension, pixel regions which are adjacent to each other do not share a gate line;

the detection substrate further includes a transparent bias voltage layer on a side of a layer where the plurality of photosensitive devices are located facing away from the base substrate; and the transparent bias voltage layer includes a plurality of first hollow structures extending in a direction same as the direction of the plurality of gate lines extension;

orthographic projections of the first hollow structures on the base substrate and orthographic projections of the plurality of gate lines on the base substrate have overlapping regions; and a width of a first hollow structures in a direction of the plurality of data lines extension is larger than a sum of a width of adjacent two gate lines and a distance between the adjacent two gate lines.

In some embodiments, the detection substrate provided by the embodiments of the present disclosure further includes: a transparent bias voltage layer on a side of a layer where the plurality of photosensitive devices are located facing away from the base substrate; and the transparent bias voltage layer includes a plurality of second hollow structures extending in a direction same as a direction of the plurality of data lines extension;

orthographic projections of the second hollow structures on the base substrate and orthographic projections of the plurality of data lines on the base substrate have overlapping regions; and a width of a second hollow structure in the direction of the plurality of gate lines extension is larger than a line width of the data line.

In some embodiments, the detection substrate provided by the embodiments of the present disclosure further includes: a second insulating layer between the layer where the plurality of photosensitive devices are located and the transparent bias voltage layer, and the second insulating layer includes a plurality of second through holes; and an orthographic projection of the transparent bias voltage layer on the base substrate completely covers an orthographic projection of the plurality of second through holes on the base substrate; and the transparent bias voltage layer is electrically connected with the plurality of second electrode through the plurality of second through holes.

In some embodiments, in the detection substrate provided by the embodiments of the present disclosure, the second insulating layer includes a second planarization layer and a second protective layer stacked; and each of the plurality of second through holes includes a third through sub-hole in the second planarization layer, and a fourth through sub-hole in the second protective layer; where the third through sub-hole and the fourth through sub-hole are arranged through with each other, and an orthographic projection of the fourth through sub-hole on the base substrate is located in an orthographic projection of the third through sub-hole on the base substrate.

In some embodiments, in the detection substrate provided by the embodiments of the present disclosure, shapes of orthographic projections of the third through sub-hole, the fourth through sub-hole, and the second electrode on the base substrate are all the same as a shape of the orthographic projection of the photoelectric conversion layer on the base substrate.

In some embodiments, in the detection substrate provided by the embodiments of the present disclosure, shapes of the orthographic projections of the photoelectric conversion layer, the main portion, the protrusion portion, and the second electrode on the base substrate are all square.

On the other hand, embodiments of the present disclosure provide a detection apparatus, including the above-mentioned detection substrate provided by the embodiments of the present disclosure.

DETAILED DESCRIPTION

Figure 1:
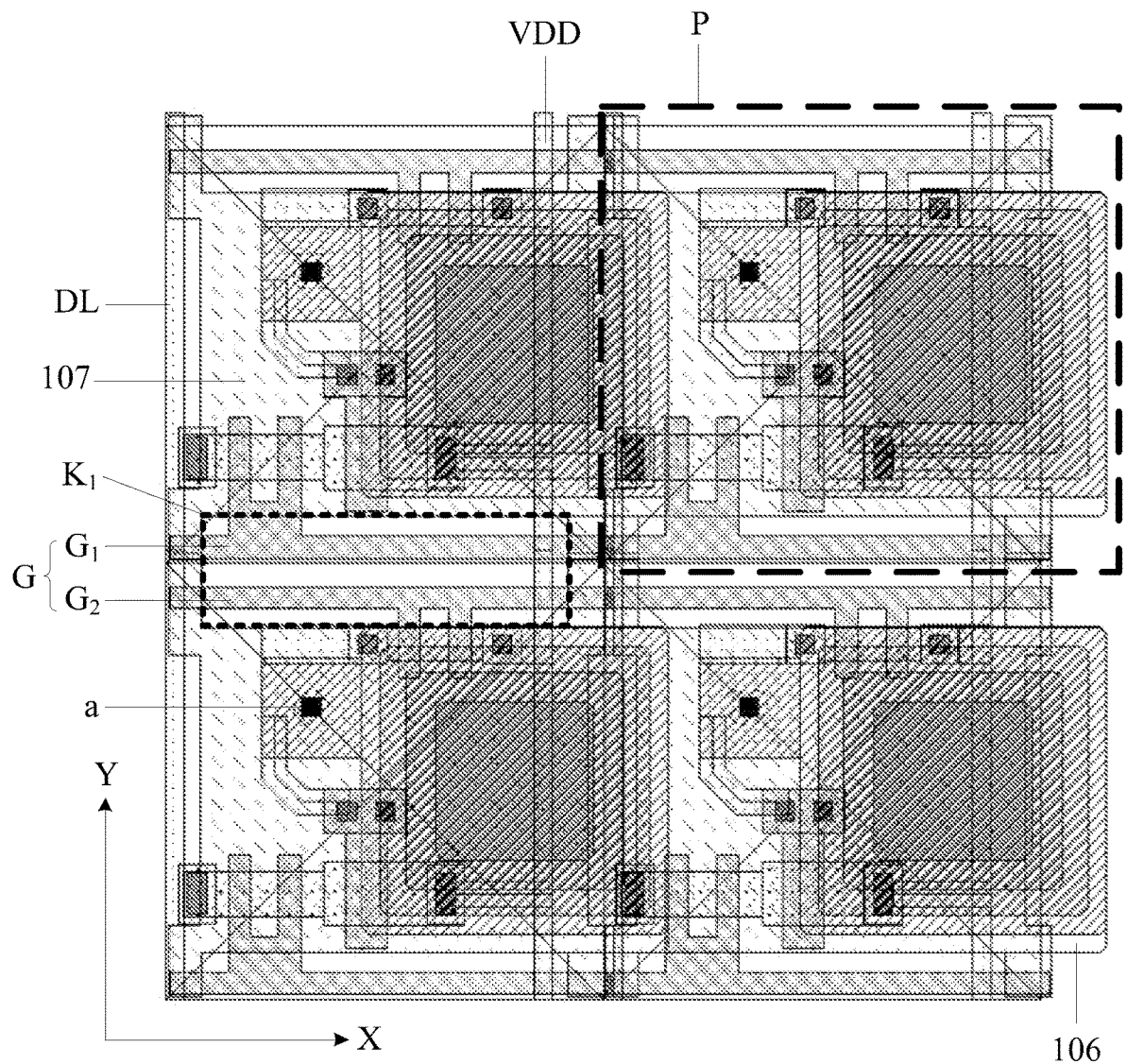
FIG. 1 is a schematic structural diagram of a detection substrate provided by embodiments of the present disclosure.

In order to make the purpose, technical solutions and advantages of the embodiments of the present disclosure clearer, the technical solutions of the embodiments of the present disclosure will be clearly and completely described below in conjunction with the accompanying drawings of the embodiments of the present disclosure. It should be noted that the size and shape of each figure in the drawings do not reflect the true scale, but are only intended to illustrate the content of the present disclosure. The same or similar reference numerals represent the same or similar elements or elements having the same or similar functions throughout.

Unless otherwise defined, the technical terms or scientific terms used herein shall have the usual meanings understood by those having ordinary skill in the art to which the present disclosure belongs. "First", "second" and similar words used in the present disclosure and claims do not indicate any order, quantity or importance, but are only used to distinguish different components. "Comprising" or "including" and similar words mean that the elements or items appearing before the word include the elements or items and their equivalents listed after the word, without excluding other elements or items. "Inner", "outer", "upper", "lower" and so on are only used to indicate relative positional relationship. When the absolute position of the described object changes, the relative positional relationship may also change accordingly.

In related art, in order to improve the pixel filling rate, a pixel drive circuit and a photosensitive device (PD) are usually designed in stacked layers, that is, the pixel design adopts the mode of separating the pixel drive circuit and the photosensitive device from top to bottom, and an insulating layer is used to isolate the pixel drive circuit and the photosensitive device. In specific implementation, the pixel drive circuit is first prepared on a base substrate, then the insulating layer is deposited, and the insulating layer is patterned to form a through hole(s) via which the pixel drive circuit and the photosensitive device are connected with each other, and finally the photosensitive device is prepared on the insulating layer, so that the photosensitive device covers the through hole, and is electrically connected with the pixel drive circuit through the through hole. However, the insulating layer is relatively thick, and in order to ensure a good electrical connection between the pixel drive circuit and the photosensitive device, it is necessary to make the through hole in the insulating layer larger. In this way, the photoelectric conversion layer of the photosensitive device will cover the steep slope at the through hole, which will cause excessive leakage current and cause the collected image to be full of white spots.

In order to at least solve the above-mentioned technical problems existing in related art, an embodiment of the present disclosure provides a detection substrate, as shown in FIG. 1 to FIG. 15, including:

a base substrate 101;

a plurality of pixel drive circuits 102 on the base substrate 101;

a first insulating layer 103 on a side of a layer where the plurality of pixel drive circuits 102 are located facing away from the base substrate 101, where the first insulating layer 103 includes a plurality of first through holes a; and a plurality of photosensitive devices 104 on a side of the first insulating layer 103 facing away from the layer where the plurality of drive circuits 102 are located. The photosensitive device 104 includes a first electrode 1041, a photoelectric conversion layer 1042 and a second electrode 1043 that are stacked, where the first electrode 1041 includes a main portion 411 carrying the photoelectric conversion layer 1042, and the protrusion portion 412 extending from one side of the main portion 411 to cover a first through hole a, the protrusion portion 412 is electrically connected with a pixel drive circuit 102 through the first through hole a, and an orthographic projection of the photoelectric conversion layer 1042 on the base substrate 101 and an orthographic projection of the first through hole a on the base substrate 101 are arranged side by side.

In the above-mentioned detection substrate provided by the embodiment of the present disclosure, the first electrode 1041 is configured to include the main portion 411 and the protrusion portion 412 extending from one side of the main portion 411, and the photoelectric conversion layer 1042 on the main portion 411, and the first through hole a under the protrusion portion 412, so that the orthographic projection of the photoelectric conversion layer 1042 on the base substrate 101 is arranged side by side with the orthographic projection of the first through hole a on the base substrate 101, whereby the photoelectric conversion layer 1042 avoids the first through hole a, and is avoided from covering the steep slope of the first through hole a, and the high flatness of the photoelectric conversion layer 1042 is ensured, thereby reducing the influence of interface defects and preventing the excessive leakage current, reducing the occurrence of white spots in the collected image and improving the image quality.

In some embodiments, the photoelectric conversion layer 1042 provided in the embodiments of the present disclosure may include a P-type semiconductor layer, an I-type semiconductor layer (also referred to as an intrinsic semiconductor layer), and an N-type semiconductor layer that are stacked. The photoelectric conversion layer 1042 and the second electrode 1043 can be formed by one patterning process. In some embodiments, in order to reduce the leakage current, the orthographic projection of the second electrode 1043 on the base substrate 101 needs to be slightly smaller than orthographic projection of the photoelectric conversion layer 1042 on the base substrate 101. For example, the distance between the boundary of the orthographic projection of the second electrode 1043 on the base substrate 101 and the boundary of the orthographic projection of the photoelectric conversion layer 1042 on the base substrate 101 may range from 0.5 μm to 2 μm.

In some embodiments, the pixel drive circuit 102 can be in a Passive Pixel Sensor (PPS) mode or an Active Pixel Sensor (APS) mode. The APS mode is a pixel design scheme to improve the image quality and reduce the noise interference. The pixel drive circuit 102 in the APS mode amplifies the electrical signal provided by the photosensitive device 104 that is easily affected by noise to minimize the impact of the external read noise source associated with the amplifier of the external chip (IC), is less affected by impedance, and can be fabricated in the large area. Each transistor in the pixel drive circuit 102 in APS mode can adopt the low temperature polysilicon (LTPS) process to obtain the higher carrier mobility, which is beneficial to realize high frame rate imaging in glass-based optical detection. It can fully replace the existing amorphous silicon (a-Si)-based pixel drive circuit 102 in the PPS mode, both application scenarios and markets of which can be improved.

In some embodiments, as shown in FIG. 4 to FIG. 11, the pixel drive circuit 102 in the APS mode provided by the present disclosure may include: a reset transistor (Reset TFT) $T_1$, an amplifying transistor (AMP TFT) $T_2$, a read transistor (Read TFT) $T_3$ and a capacitor C. A gate electrode of the reset transistor $T_1$ is electrically connected with a first gate line $G_1$, a first terminal of the reset transistor $T_1$ is electrically connected with the first electrode 1041 through the first through hole a, and is connected with a gate electrode of the amplifying transistor $T_2$ through the third through hole c and the fourth through hole d, and a second terminal of the reset transistor $T_1$ is electrically connected with a power supply line VDD. A first terminal of the amplifying transistor $T_2$ is electrically connected with a second terminal of the read transistor $T_3$, and a second terminal of the amplifying transistor $T_2$ is electrically connected with the power supply line VDD. A gate electrode of the read transistor $T_3$ is electrically connected with a second gate line $G_2$, and a first terminal of the read transistor $T_3$ is electrically connected with a data line DL. The capacitor C is set in parallel with the photosensitive device PD. An active layer of each of the transistors is electrically connected with the first terminal of each transistor and the second terminal of each transistor through the corresponding fifth through hole e. In some embodiments, the first terminal of the amplifying transistor $T_2$ and the second terminal of the read transistor $T_3$ can be made of conductive active layer materials.

It should be noted that each of the aforementioned transistors may be top-gate transistors or bottom-gate transistors, which will not be limited herein. Preferably, each of the transistors is a low temperature polysilicon transistor, but in some embodiments, each of the transistors may also be an amorphous silicon transistor, an oxide transistor, a field effect transistor, or the like. In addition, the first terminal and the second terminal of each transistor are the drain and the source respectively, functions of which can be interchanged according to different transistor types and input signals, and no specific distinction is made here. Generally, when the transistor is a P-type transistor, the first terminal is the source, and the second terminal is the drain, and when the transistor is an N-type transistor, the first terminal is the drain, and the second terminal is the source.

Figure 4:
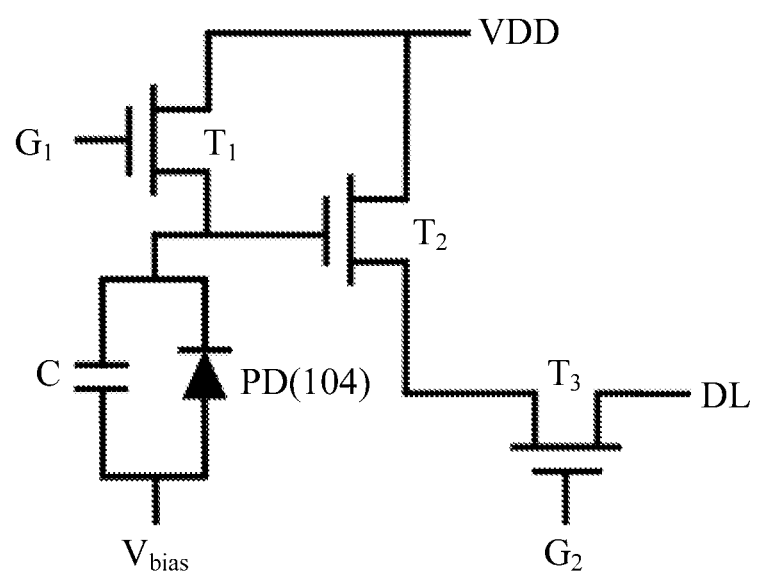
FIG. 4 is a schematic structural diagram of the pixel drive circuit in FIG. 2.
Figure 5:
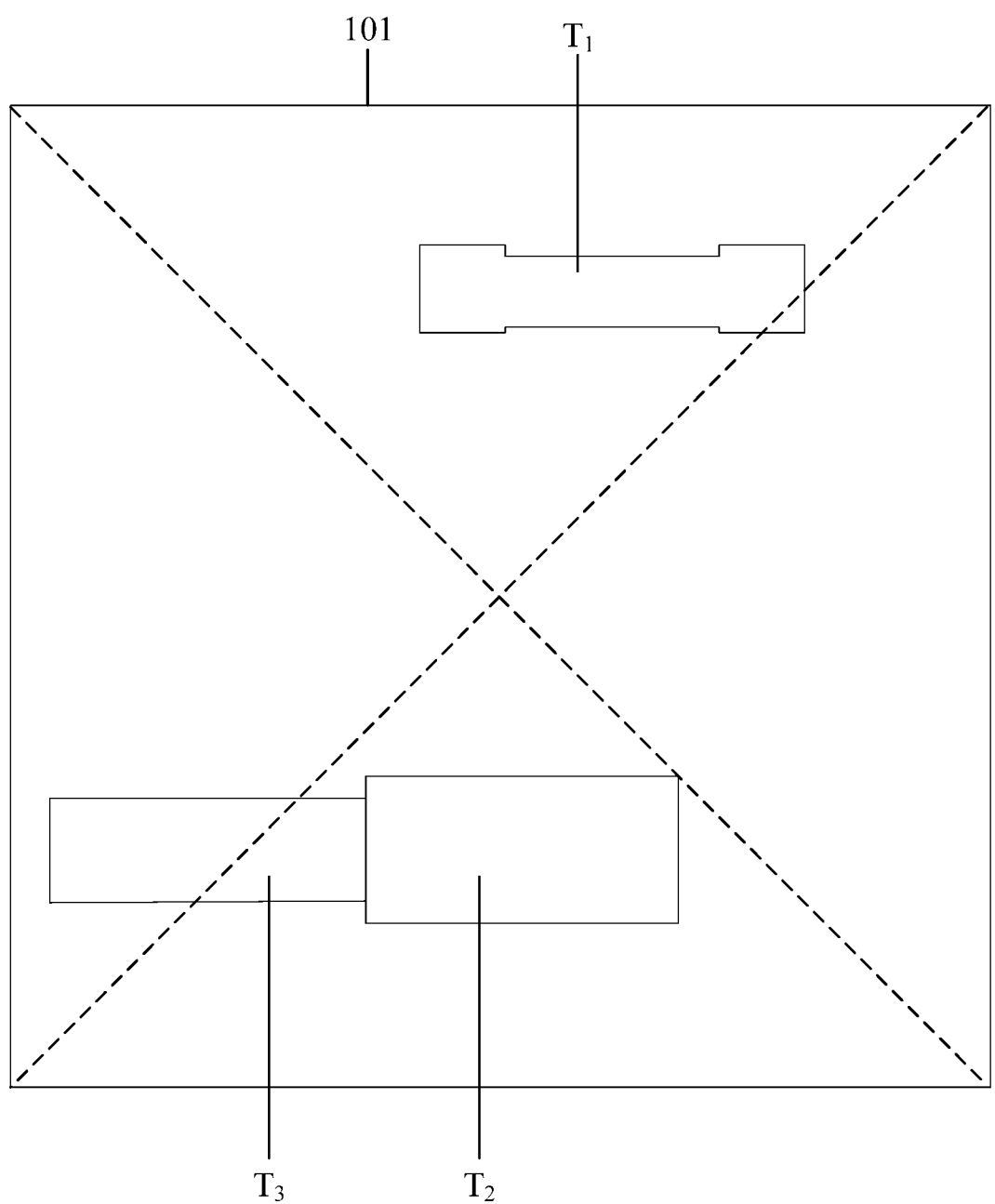
FIG. 5 is a schematic structural diagram of an active layer in FIG. 2.
Figure 6:
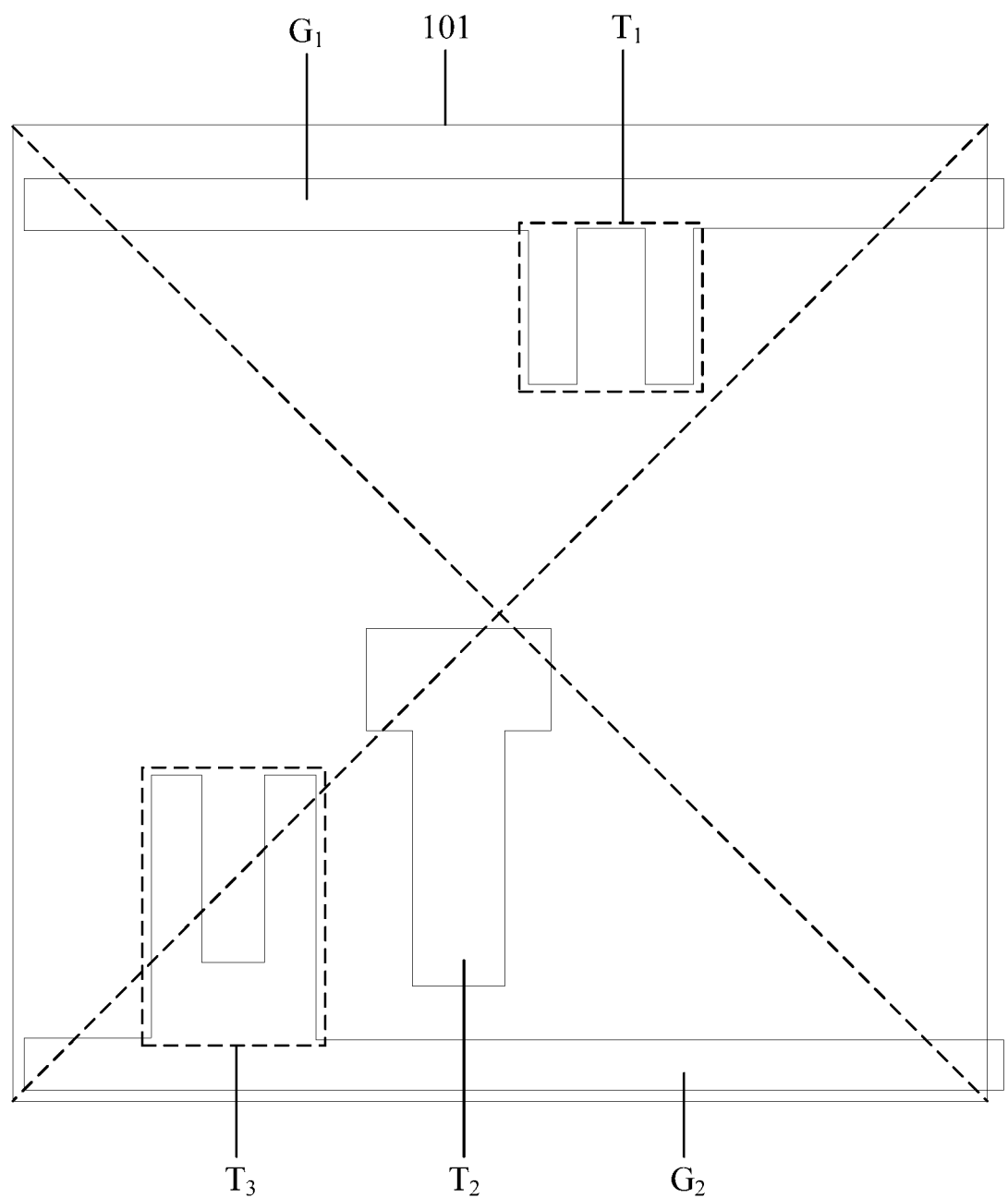
FIG. 6 is a schematic structural diagram of a gate electrode metal layer in FIG. 2.
Figure 7:
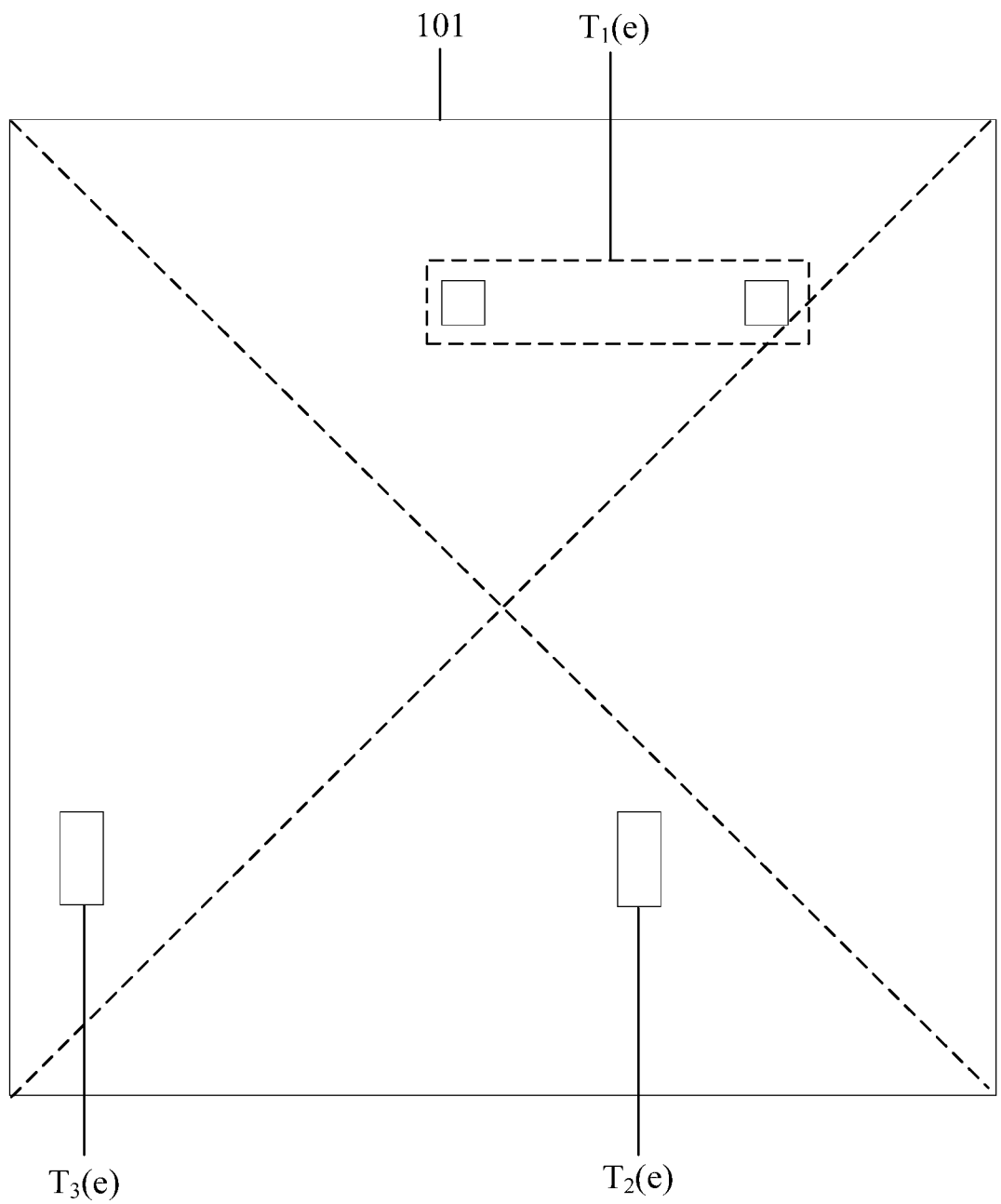
FIG. 7 is a schematic structural diagram of a gate electrode insulating layer in FIG. 2.
Figure 8:
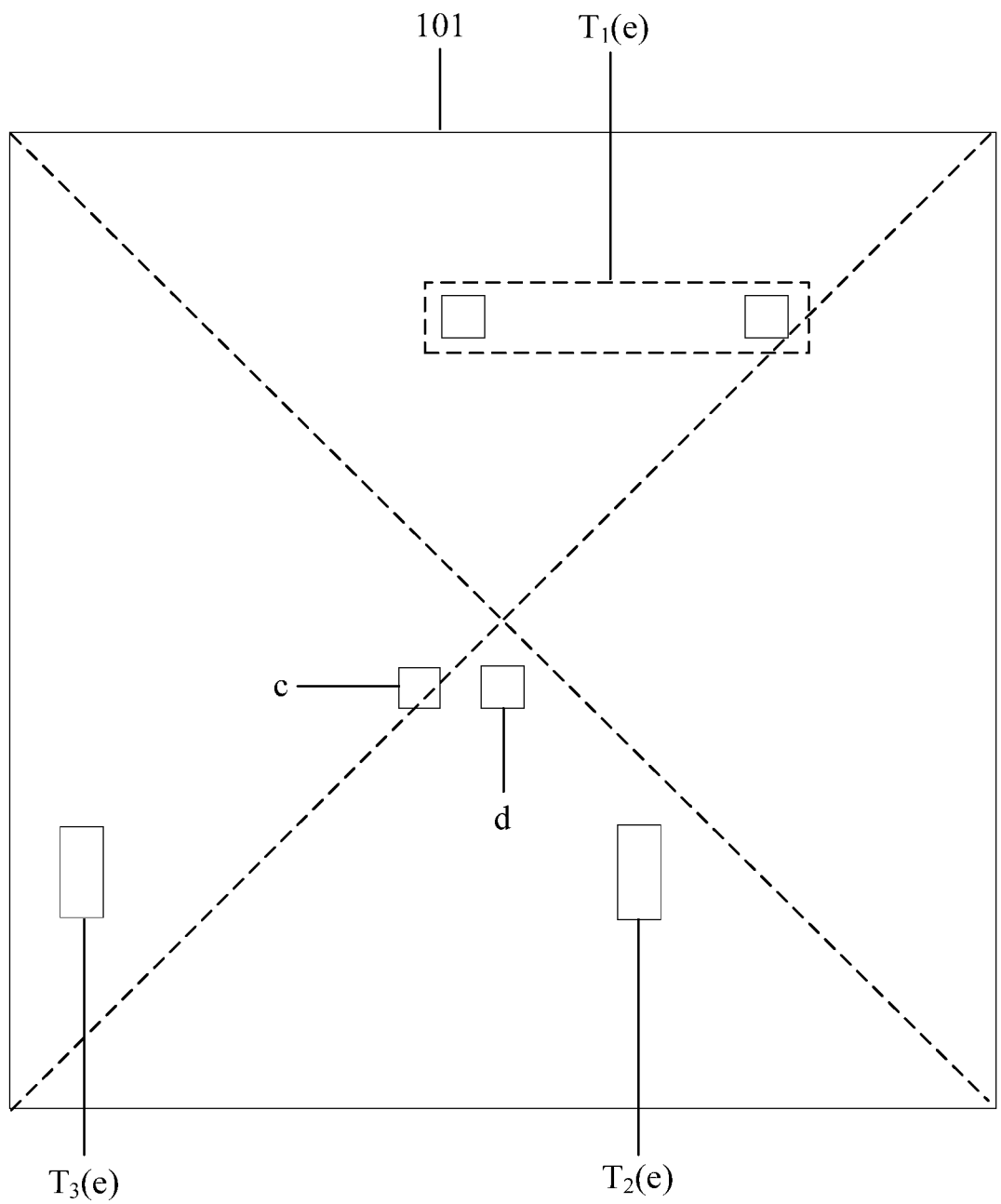
FIG. 8 is a schematic structural diagram of an interlayer dielectric layer in FIG. 2.
Figure 9:
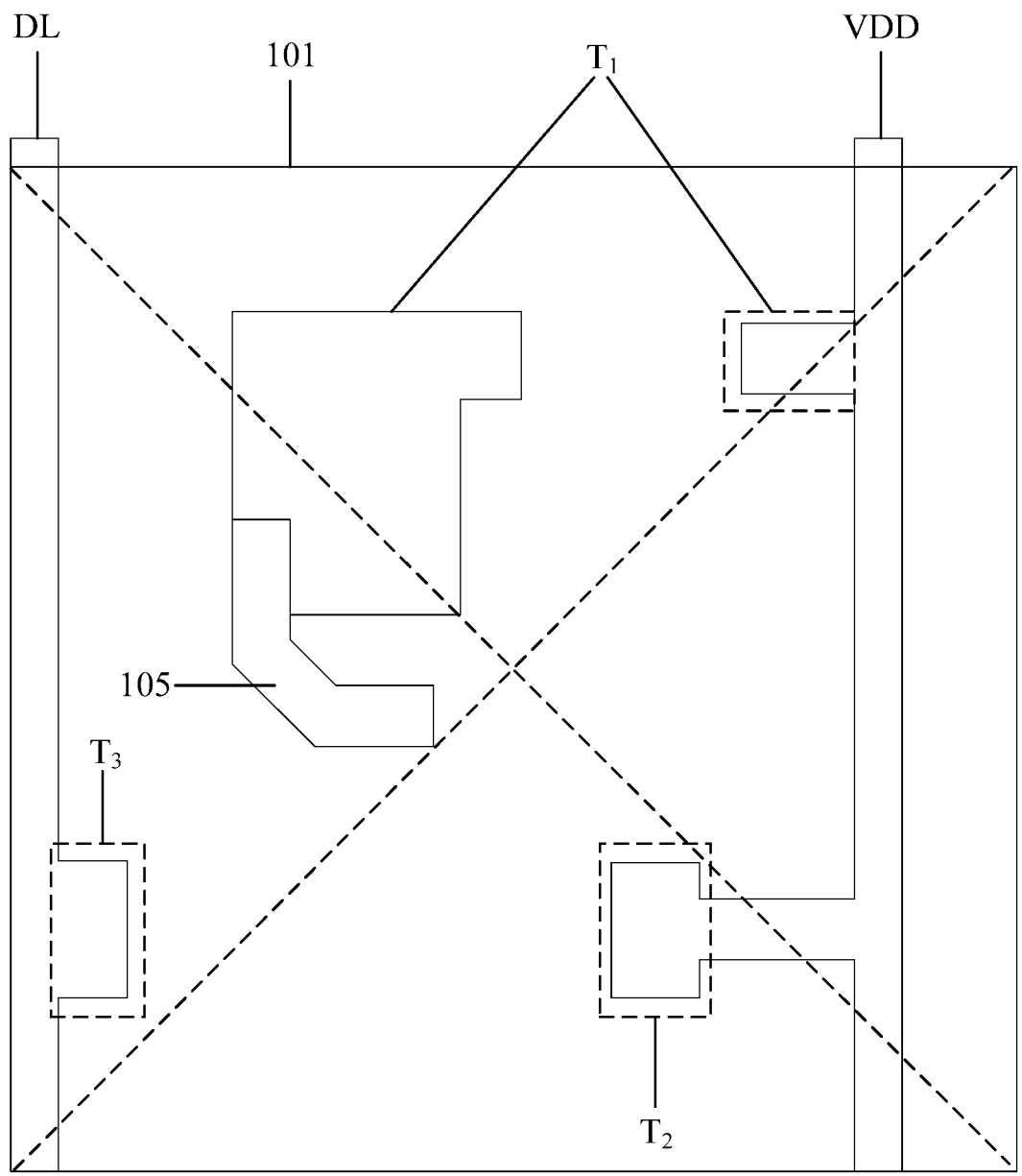
FIG. 9 is a schematic structural diagram of a source-drain metal layer in FIG. 2.

In actual implementation, in FIG. 4, the reset transistor $T_1$ controls a potential of the gate electrode of the amplifying transistor $T_2$ to reset, the amplifying transistor $T_2$ amplifies the current signal output by the photosensitive device PD, and the read transistor $T_3$ provides the amplified current signal to the data line DL. In some embodiments, the power supply line VDD is connected with a DC potential of about +5V, and the bias voltage layer $V_{bias}$ is connected with a DC potential of about 0 V, so that the photosensitive device PD is in a reverse bias state. The specific operating process of the pixel drive circuit 102 shown in FIG. 4 is as follows. First, the reset transistor $T_1$ is turned on under the control of the first gate line $G_1$, so that the potential of the gate electrode of the amplifying transistor $T_2$ is reset to the signal provided by the power supply line VDD, and the amplifying transistor $T_2$ operates in a saturated state. Then, the photosensitive device PD enters an exposure stage, and the photosensitive device PD is reversely biased to generate a photocurrent signal. Finally, the read transistor $T_3$ is turned on under the control of the second gate line $G_2$, and the external read chip (e.g., read out integrated circuit, ROIC) reads the variation of the potential of the gate electrode of the amplifying transistor $T_2$ (which is equivalent to the current signal on the path between the amplifying transistor $T_2$ and the read transistor $T_3$) via the data line DL.

In order to facilitate the understanding to the technical solution of the present disclosure, the pixel drive circuit 102 of the present disclosure has the structure shown in FIG. 4 as an example for description.

In some embodiments, in the detection substrate provided by the embodiments of the present disclosure, as shown in FIG. 1, the gate lines G and the data lines DL intersect to define a plurality of pixel regions P. FIG. 1 In some embodiments shows 2*2 pixel regions P. Each pixel region P arranged one-to-one corresponding with the first through hole a, and one pixel drive circuit 102 and one photosensitive device 104 are electrically connected through the first through hole a. The orthographic projection of the first through hole a on the base substrate 101 and the orthographic projection of the photoelectric conversion layer 1042 on the base substrate 101 can be arranged side by side in an extension direction X of the gate line, so as to reserve an enough space for the photoelectric conversion layer 1042.

Figure 2:
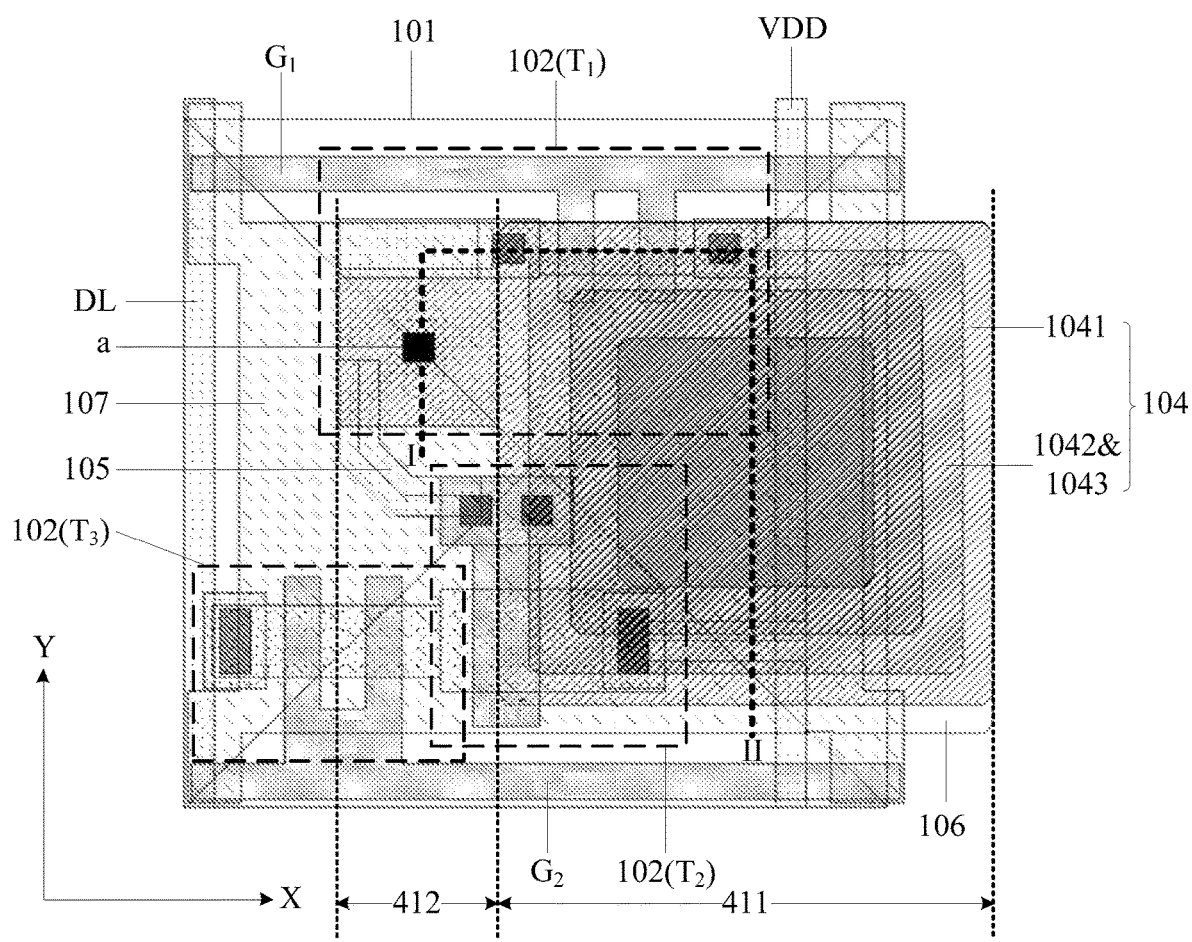
FIG. 2 is a schematic structural diagram of a pixel region in FIG. 1.

In some embodiments, in the above detection substrate provided by the embodiments of the present disclosure, as shown in FIG. 2, the orthographic projection of the first through hole a on the base substrate 101 is in a pixel region corresponding to this first through hole a, and the orthographic projection of the photoelectric conversion layer 1042 on the base substrate 101 extends into an adjacent pixel region P that is adjacent to the pixel region in a direction X in which the gate lines extend. This setting method can make the film layer process formed before the photosensitive device 104 following the preparing process in the related art, so that the position of the first through hole a remains unchanged, and the photosensitive device 104 can be moved as a whole to avoid the first through hole a. At the same time, the orthographic projection of the moved photoelectric conversion layer 1042 on the base substrate 101 extends into the adjacent pixel region P in the direction X in which the gate lines extend, which is conducive to maintaining the area of the photoelectric conversion layer 1042, and can still ensure that the physical full well is not reached under strong light conditions. In some embodiments, the area percentage of the photoelectric conversion layer 1042 and the pixel region P may range from 30% to 50%, e.g., is 37.90%.

In some embodiments, in the detection substrate provided by the embodiments of the present disclosure, as shown in FIG. 1, FIG. 2, FIG. 5, FIG. 6 and FIG. 9, the read transistor $T_3$ can be located near the intersection position of the data line DL and the second gate line $G_2$, the orthographic projection of the photoelectric conversion layer 1042 on the base substrate 101 may partially overlap with an orthographic projection of a first terminal of a read transistor $T_3$, which is in the adjacent pixel region P, on the base substrate 101, so as to ensure that the photoelectric conversion layer 1042 has a relatively large area, and do not overlap with a photoelectric conversion layers 1042 adjacent to it in the direction X in which the gate lines extend. Correspondingly, as shown in FIG. 1, FIG. 2, FIG. 11 and FIG. 12, in order to provide a flat supporting surface for the photoelectric conversion layer 1042, the main portion 411 can be set to exceed the photoelectric conversion layer 1042 in the adjacent pixel region P. In some embodiments, an orthographic projection of an extension line of a side edge of the main portion 411 away from the protruding portion 412 on the base substrate 101 substantially coincides with an orthographic projection of an edge of a gate electrode of the read transistor $T_3$, which is in the adjacent pixel region P and close to the main portion 411, on the base substrate 101.

It should be noted that, in the embodiments provided in the present disclosure, due to the limitation of process conditions or the influence of other factors such as measurement, the above-mentioned "substantially coincide" may coincide exactly, or there may be some deviations, so the relationship of "substantially coincide" between the above-mentioned features falls within the claimed scope of the present disclosure as long as the error tolerance is satisfied.

In some embodiments, in the above detection substrate provided by the embodiments of the present disclosure, as shown in FIG. 1, FIG. 2, FIG. 5, FIG. 6, FIG. 9 and FIG. 12, an orthographic projection of the amplifying transistor $T_2$ is located on a side of the read transistor $T_3$ away from the data line DL electrically connected with the read transistor $T_3$. The orthographic projection of the photoelectric conversion layer 1042 on the base substrate 101 overlaps with an orthographic projection of a gate electrode of the amplifying transistor $T_2$, which is in the same pixel region P as the photoelectric conversion layer, on the base substrate, so as to ensure that the photoelectric conversion layer 1042 has a relatively large area, and is staggered from the first through hole a.

In some embodiments, in the above detection substrate provided by the embodiments of the present disclosure, in order to increase the compatibility with related preparing processes, the position of the first through hole a can be kept unchanged, and as shown in FIG. 2, and FIG. 5 to FIG. 10, in the same pixel region P, the orthographic projection of the first through hole a on the base substrate 101 may be located at a diagonal line, away from the read transistor $T_3$, of the pixel region P.

In some embodiments, in the above detection substrate provided by the embodiments of the present disclosure, as shown in FIG. 2, and FIG. 5 to FIG. 11, the gate electrode of the read transistor $T_3$ includes two gate electrodes, and in order to completely cover the first through hole a and not overlap with the main portion 411 in the adjacent pixel region P, in the same pixel region P, an orthographic projection of an extension line of a side edge of the protruding portion 412 away from the main portion 411 on the base substrate 101 can be located between the two gate electrodes of the read transistor $T_3$.

In some embodiments, in the detection substrate provided by the embodiments of the present disclosure, as shown in FIG. 2, FIG. 5 to FIG. 11, in order to provide a flat supporting surface for the photoelectric conversion layer 1042, an orthographic projection of a boundary line S between the main portion 411 and the protrusion portion 412 on the base substrate 101 and an orthographic projection of the gate electrode of the amplifying transistor $T_2$ on the base substrate 101 have an overlapping area. An overlapping width of the orthographic projection of the main portion 411 on the base substrate 101 and the orthographic projection of the gate electrode of the amplifying transistor $T_2$ on the base substrate in the direction X in which the gate lines extend, is set to be larger than an overlapping width of the orthographic projection of the photoelectric conversion layer 1042 on the base substrate 101 and the orthographic projection of the gate electrode of the amplifying transistor $T_2$ on the base substrate in the direction X in which the gate lines extend.

In some embodiments, in the detection substrate provided by the embodiments of the present disclosure, as shown in FIG. 2, FIG. 8, FIG. 9 and FIG. 12, the pixel drive circuit 102 may further include a connection electrode 105, a first terminal of the reset transistor $T_1$ is electrically connected with the gate electrode of the amplifying transistor $T_2$ through the connection electrode 105. In some embodiments, the connection electrode 105 can be integrated with the first terminal of the reset transistor $T_1$, and connected with the gate electrode of the amplifying transistor $T_2$ through the third through hole c and the fourth through hole d. In some embodiments, an orthographic projection of the connection position between the connection electrode 105 and the reset transistor $T_1$ on the base substrate 101 may be located on the side of the first through hole a away from the photoelectric conversion layer 1042.

In some embodiments, in the above-mentioned detection substrate provided by the embodiments of the present disclosure, as shown in FIG. 16 to FIG. 22, in the same pixel region P, the orthographic projection of the first through hole a on the base substrate 101 and the orthographic projection of the photoelectric conversion layer 1042 on the base substrate are arranged side by side, which can be specifically realized by moving the first through hole a and the photoelectric conversion layer 1042 in the related art to opposite directions. In some embodiments, in FIG. 16, the first through hole a can be moved to the left compared to the existing position, and the photoelectric conversion layer 1042 can be moved to the right compared to the existing position, so that in the same pixel region P, the first through hole a and the photoelectric conversion layer 1042 are arranged in a staggered manner, and the area of the photoelectric conversion layer 1042 remains unchanged, which can still ensure the normal photoelectric conversion function of the photoelectric conversion layer 1042.

Figure 16:
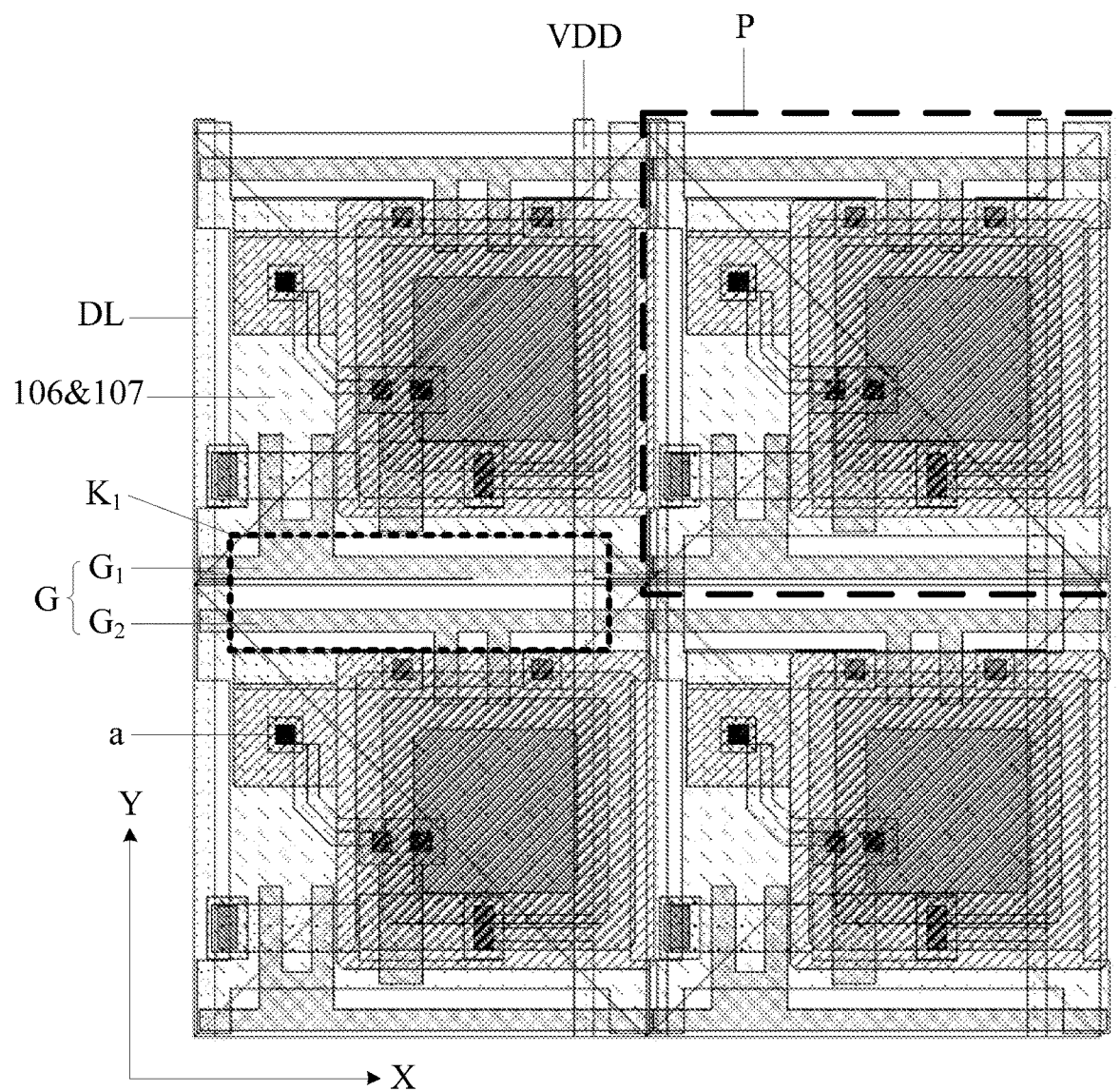
FIG. 16 is another schematic structural diagram of a detection substrate provided by embodiments of the present disclosure.
Figure 17:
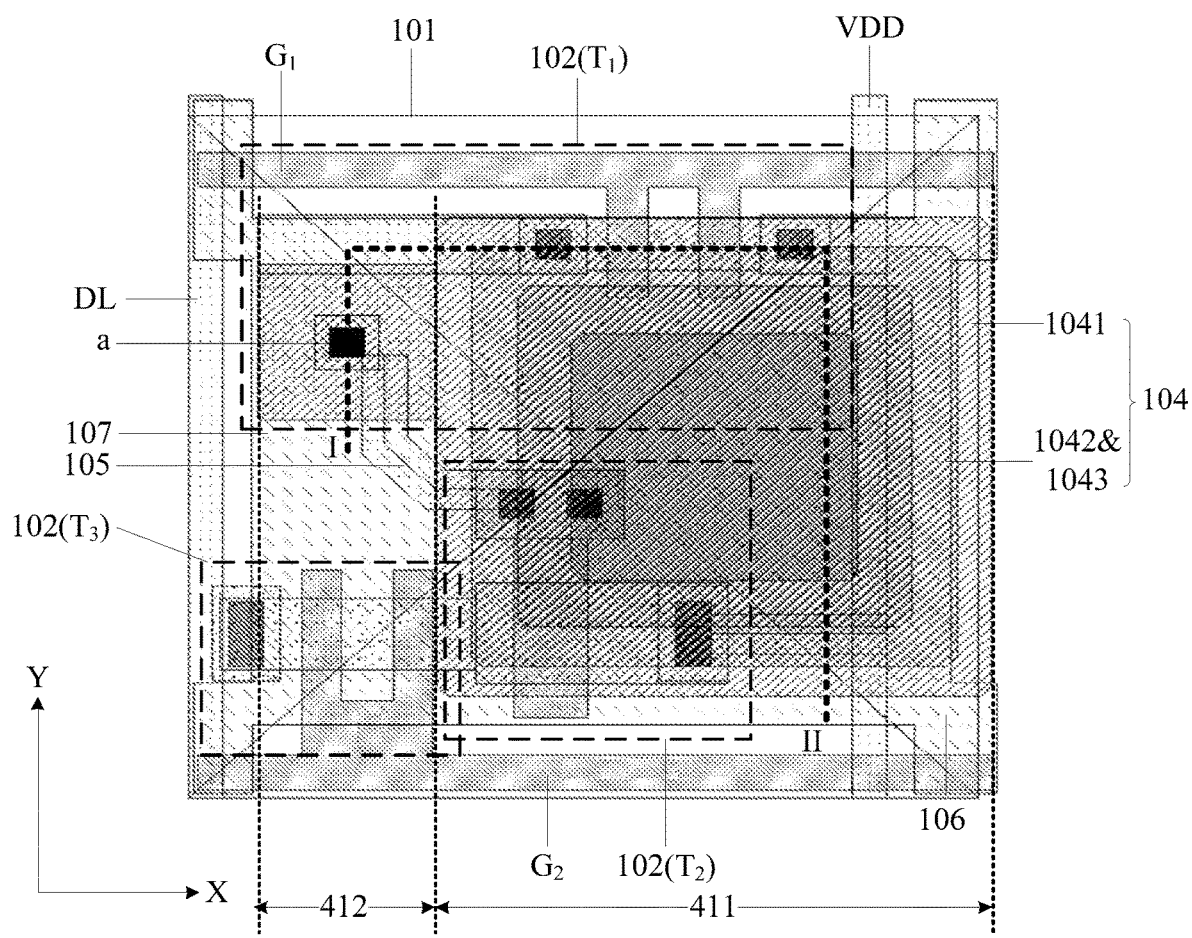
FIG. 17 is a schematic structural diagram of a pixel region in FIG. 16.
Figure 18:
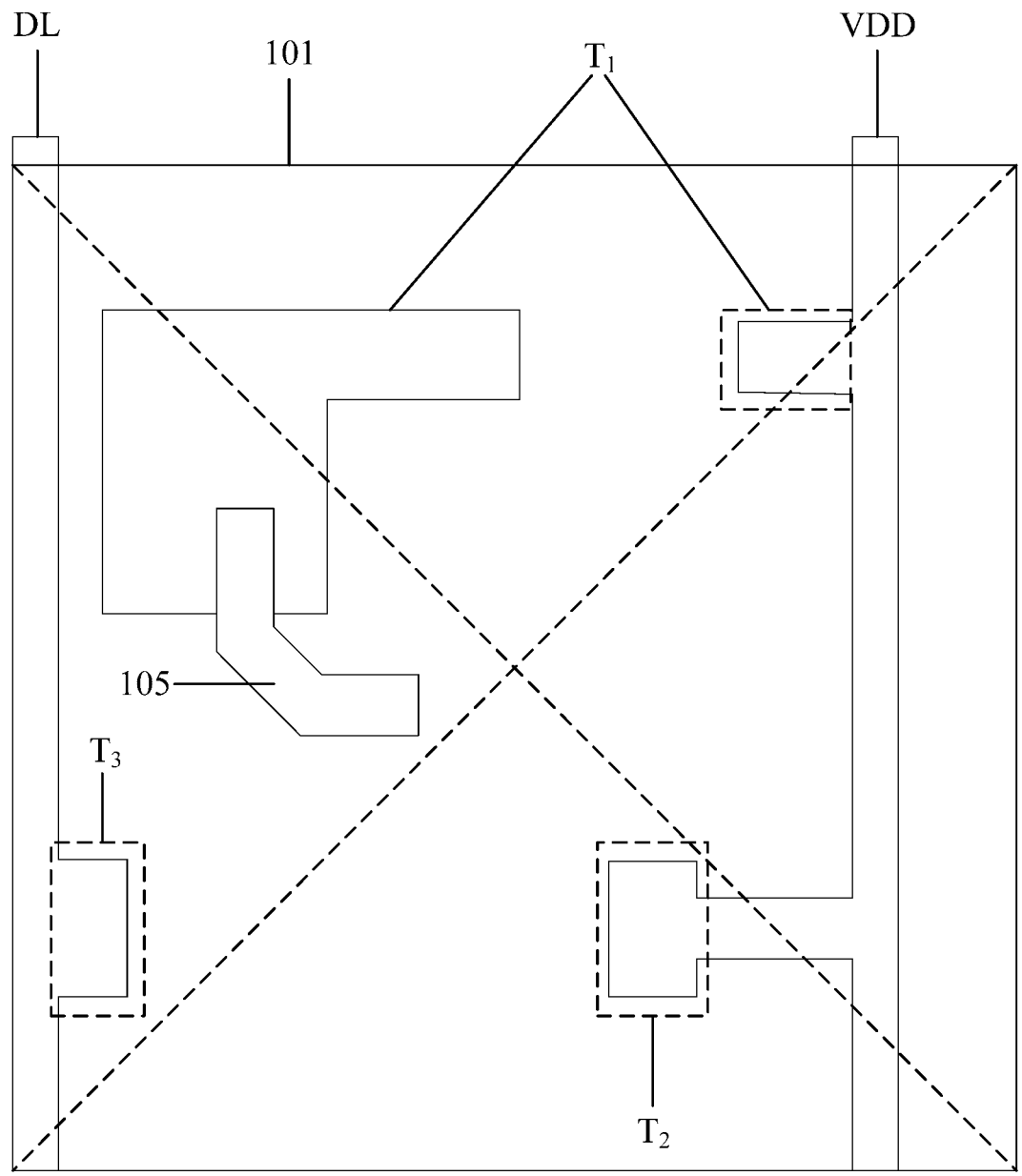
FIG. 18 is a schematic structural diagram of a source-drain metal layer in FIG. 17.
Figure 20:
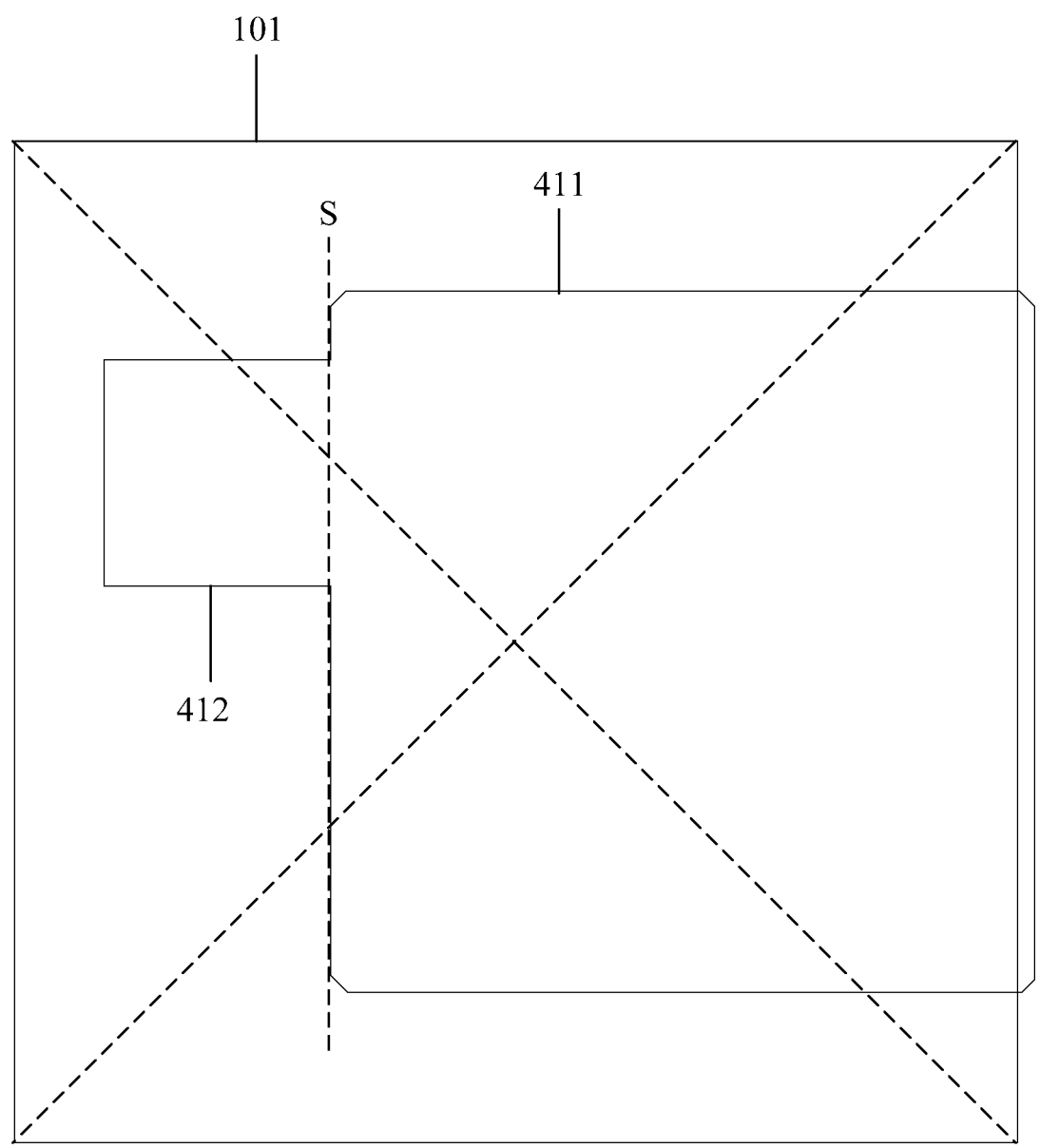
FIG. 20 is a schematic structural diagram of a first electrode in FIG. 17.
Figure 21:
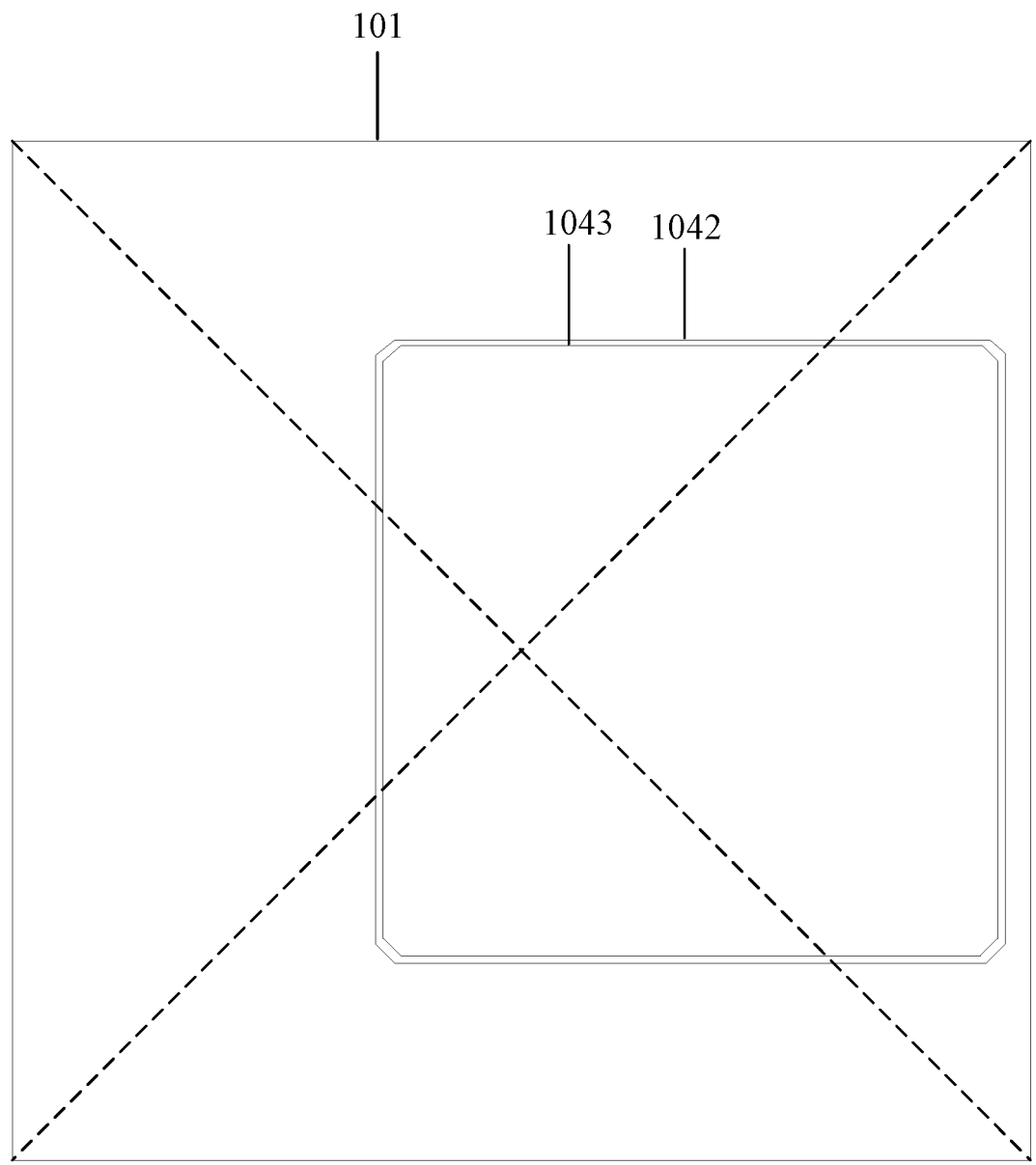
FIG. 21 is a schematic structural diagram of a photoelectric conversion layer in FIG. 17.
Figure 22:
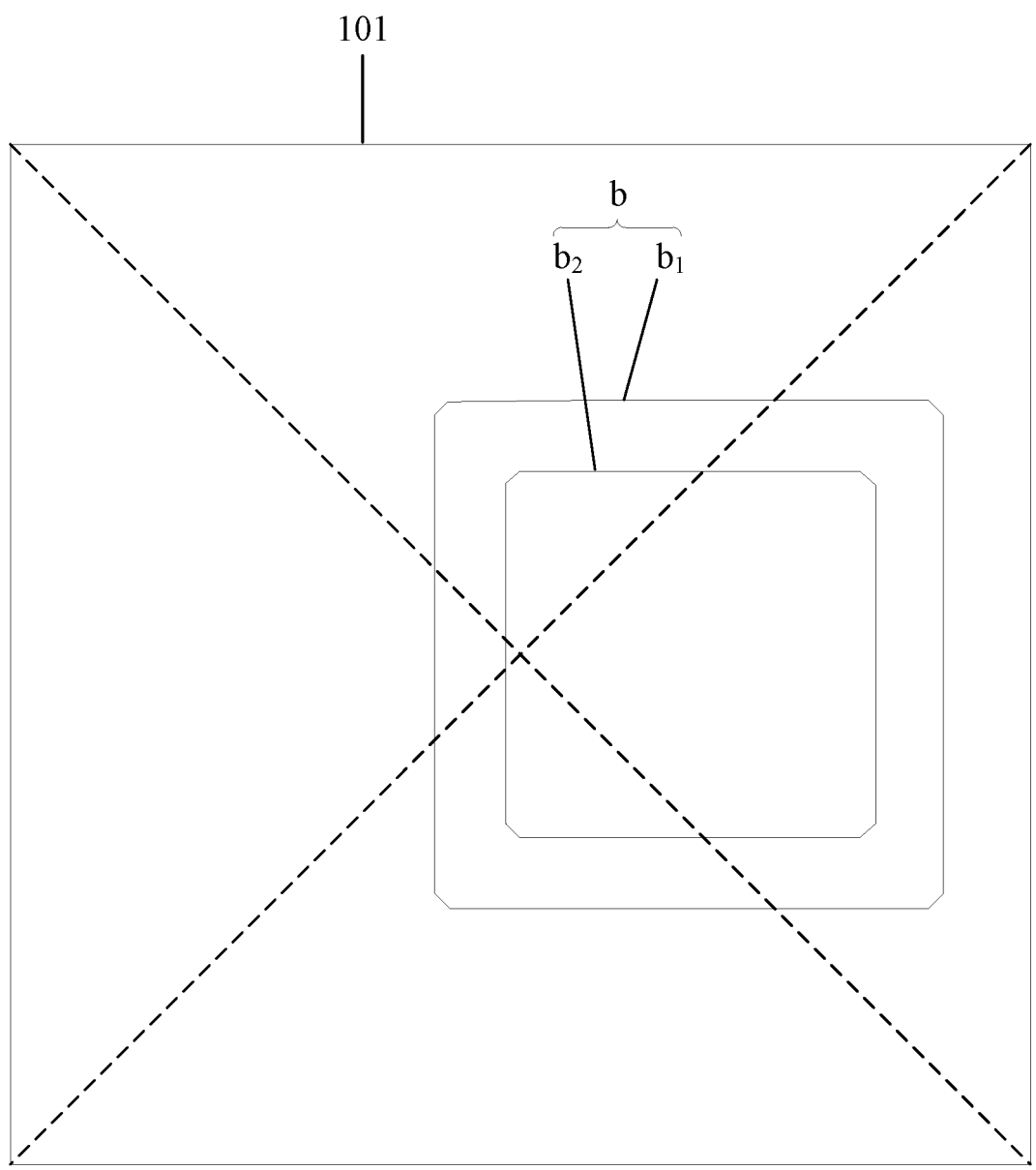
FIG. 22 is a schematic structural diagram of a second insulating layer in FIG. 17.

In some embodiments, in the above detection substrate provided by the embodiments of the present disclosure, as shown in FIG. 16 to FIG. 18, and FIG. 21, a power supply line VDD is adjacent to a data line DL electrically connected with a pixel drive circuit in an adjacent pixel region P; the orthographic projection of the photoelectric conversion layer 1042 on the base substrate 101 and an orthographic projection of the power supply line VDD on the base substrate 101 have an overlapping area; and the orthographic projection of the photoelectric conversion layer 1042 on the base substrate 101 does not overlap with an orthographic projection of the data line DL which is electrically connected with the pixel drive circuit in the adjacent pixel region P, on the base substrate 101, so as to ensure that the area of the photoelectric conversion layer 1042 is large enough to improve the pixel filling rate, and at the same time, the crosstalk between the signals of the photoelectric conversion layer 1042 and the data line DL can be avoided to reduce the noise. Correspondingly, in order to provide a flat supporting surface for the photoelectric conversion layer 1042, as shown in FIG. 16, FIG. 17 and FIG. 20, an orthographic projection of the main portion 411 on the base substrate 101 partially overlaps with the data line DL, which is electrically connected with the pixel drive circuit in the adjacent pixel region P, on the base substrate 101.

In some embodiments, in the detection substrate provided by the embodiments of the present disclosure, as shown in FIG. 5 to FIG. 9, FIG. 16 to FIG. 18, and FIG. 21, an orthographic projection of the amplifying transistor $T_2$ on the base substrate 101 is on a side of the read transistor $T_3$ away from the data line DL with which the read transistor $T_3$ is electrically connected; and an orthographic projection of an extension line of a side edge of the photoelectric conversion layer 1042 adjacent to the protruding portion 412 on the base substrate 101 is between the read transistor $T_3$ and the amplifying transistor $T_2$, which ensure that the photoelectric conversion layer 1042 has a relatively large area and is staggered from the first through hole a.

In some embodiments, in the above detection substrate provided by the embodiments of the present disclosure, as shown in FIGS. 5 to 9 and FIGS. 17 to 19, in the same pixel region P, the orthographic projection of the first through hole a on the base substrate 101 is located in a region enclosed by the data line DL, a diagonal line of the pixel region P and the read transistor $T_3$ to avoid the photoelectric conversion layer 1042.

In some embodiments, in the detection substrate provided by the embodiments of the present disclosure, as shown in FIG. 5 to FIG. 9 and FIG. 17 to FIG. 20, in the same pixel region P, an orthographic projection of an extension line of a side edge of the protrusion portion 412 away from the main part 411 on the base substrate 101 and an orthographic projection of the first terminal of the read transistor $T_3$ on the base substrate 101 have an overlapping region, so that the protrusion portion 412 can completely cover the first through hole a, and the protrusion portion 412 is limited in the pixel region P without a coupling capacitance that is generated with the data line DL.

In some embodiments, in the above detection substrate provided by the embodiments of the present disclosure, as shown in FIGS. 5 to 9, 17, 20 and 21, in order to provide a flat supporting surface for the photoelectric conversion layer 1042, in the same pixel region P, an orthographic projection of a boundary line S between the main portion 411 and the protruding portion 412 on the base substrate 101 may substantially coincide with an edge, which is adjacent to the amplifying transistor $T_2$, of a gate electrode of the read transistor $T_3$.

In some embodiments, in the detection substrate provided by the embodiments of the present disclosure, as shown in FIG. 5 to FIG. 9, FIG. 17, FIG. 18 and FIG. 20, the pixel drive circuit 102 may further include a connection electrode, the first terminal of the reset transistor $T_1$ is electrically connected with the gate electrode of the amplifying transistor $T_2$ through the connection electrode 105. In some embodiments, the connection electrode 105 can be integrated with the first terminal of the reset transistor $T_1$, and connected with the gate electrode of the amplifying transistor $T_2$ through the third through hole c. In some embodiments, an orthographic projection of the connection position between the connection electrode 105 and the reset transistor $T_1$ on the base substrate 101 is on the side of the first through hole a close to the photoelectric conversion layer 1042.

Figure 3:
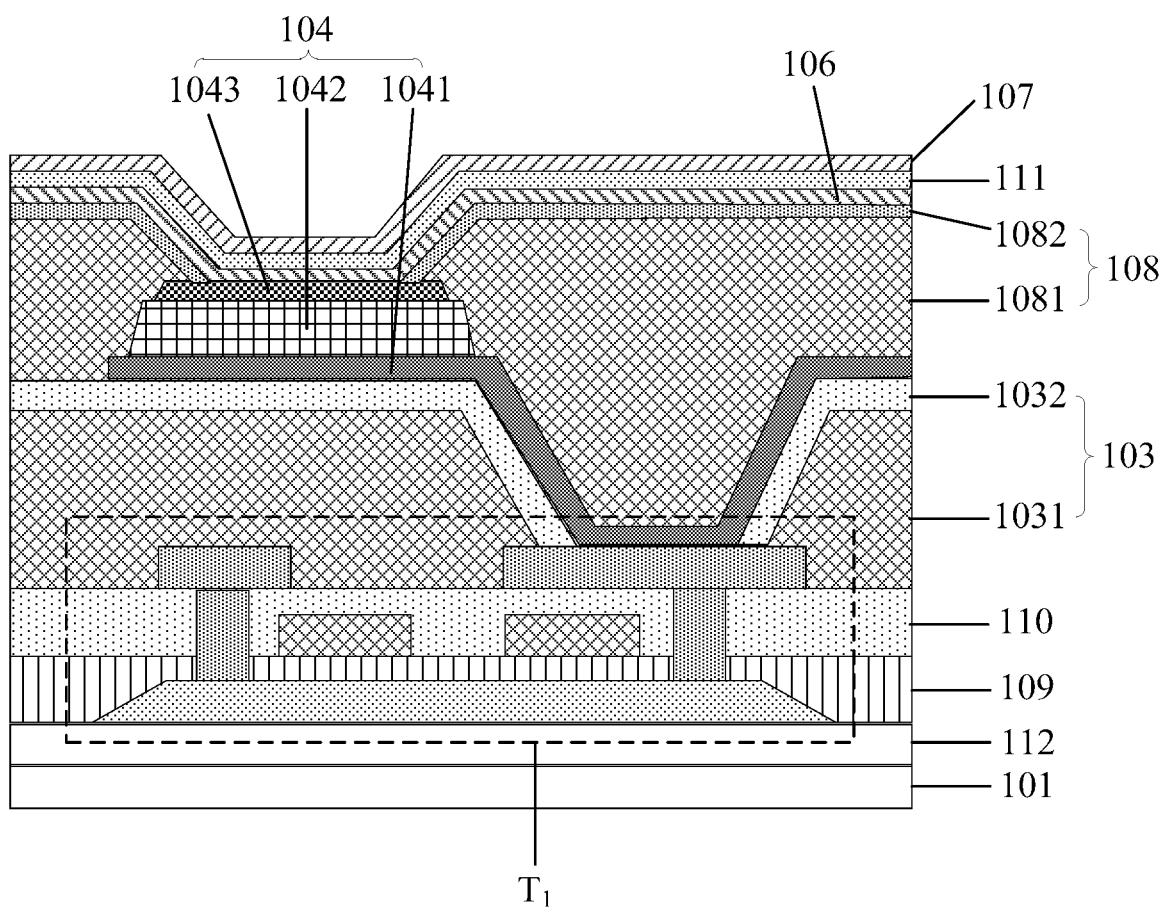
FIG. 3 is a schematic structural diagram along 1-11 line in FIG. 2.
Figure 10:
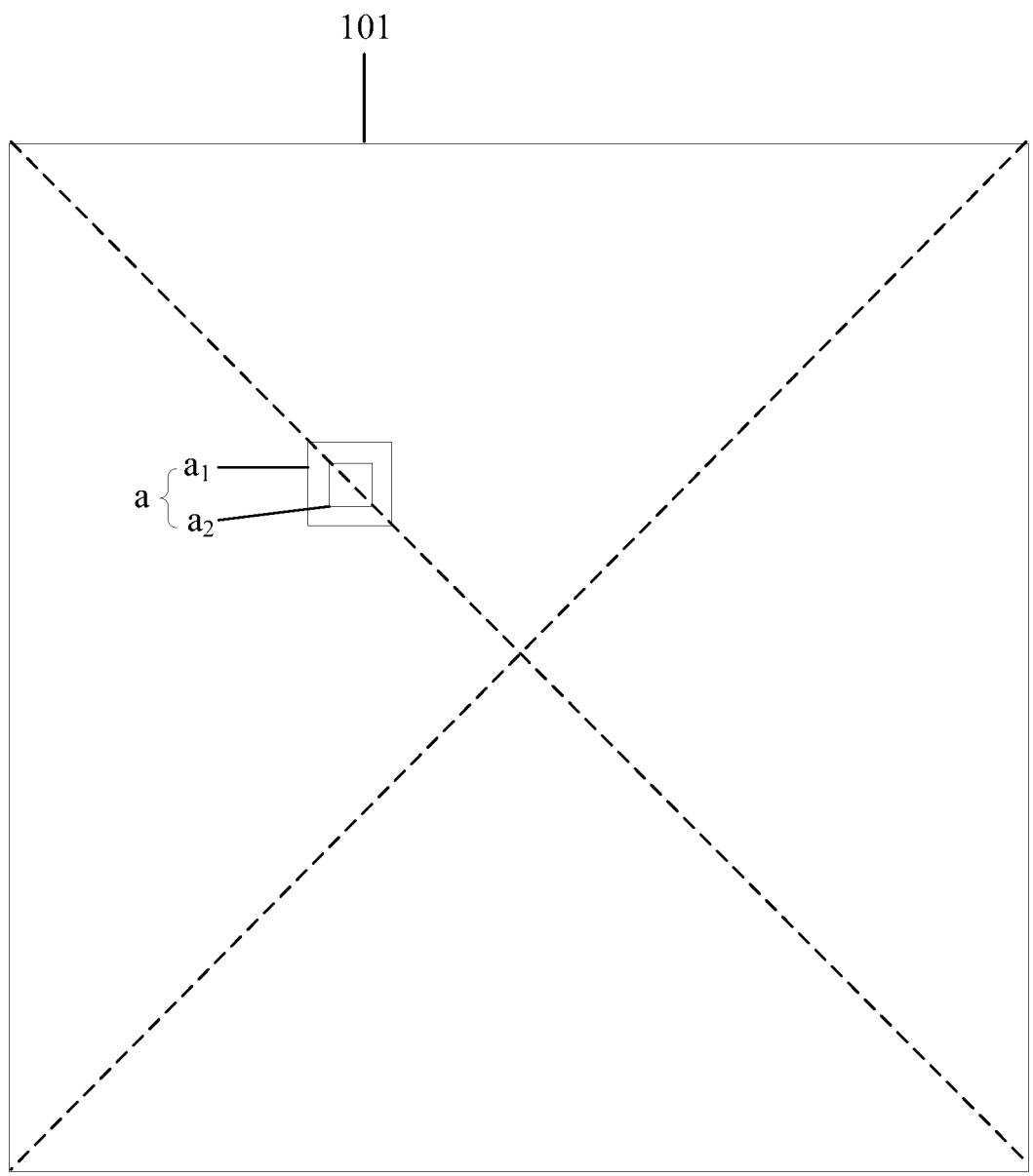
FIG. 10 is a schematic structural diagram of a first insulating layer in FIG. 2.
Figure 11:
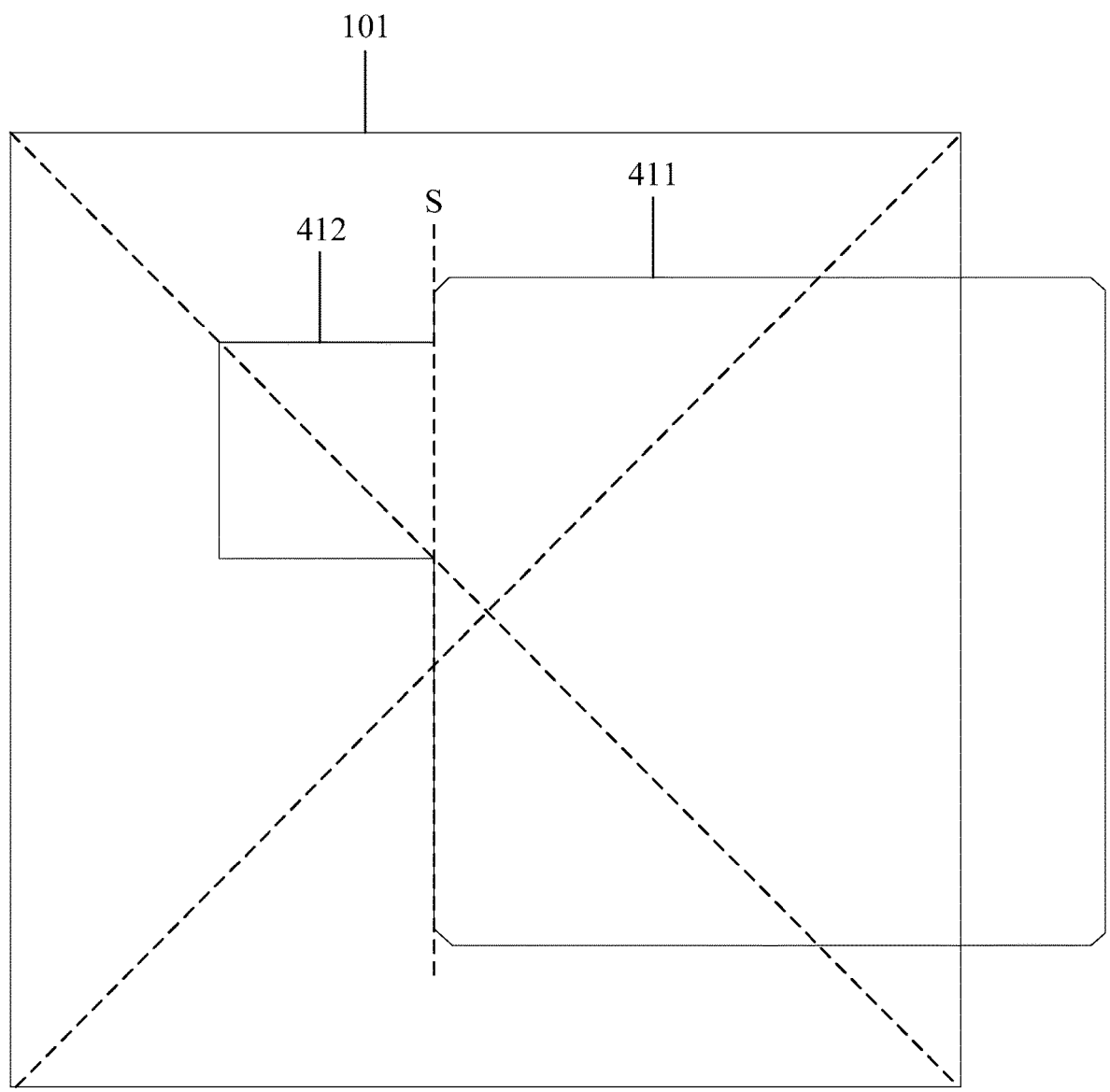
FIG. 11 is a schematic structural diagram of a first electrode in FIG. 2.
Figure 12:
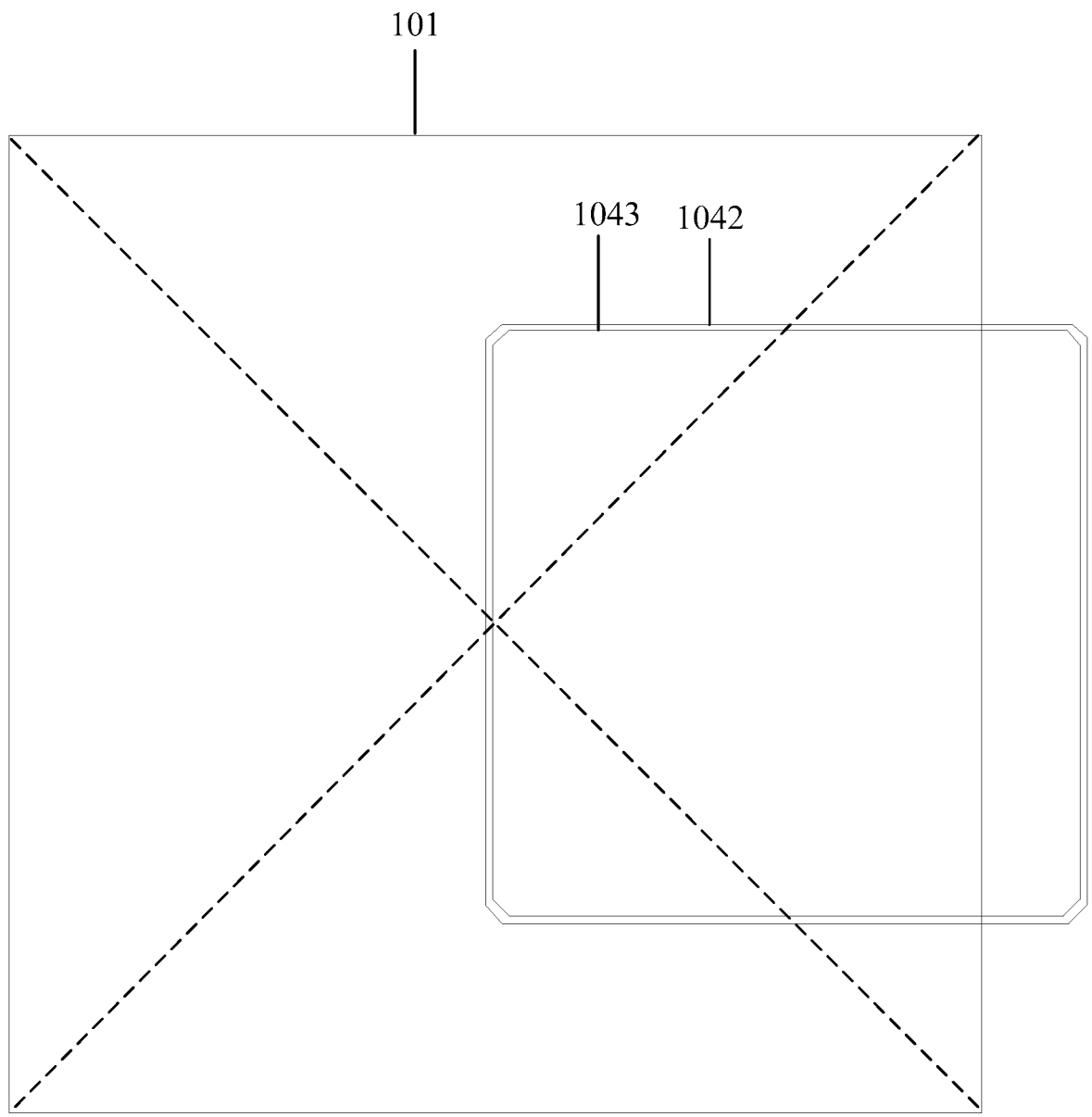
FIG. 12 is a schematic structural diagram of a photoelectric conversion layer in FIG. 2.
Figure 13:
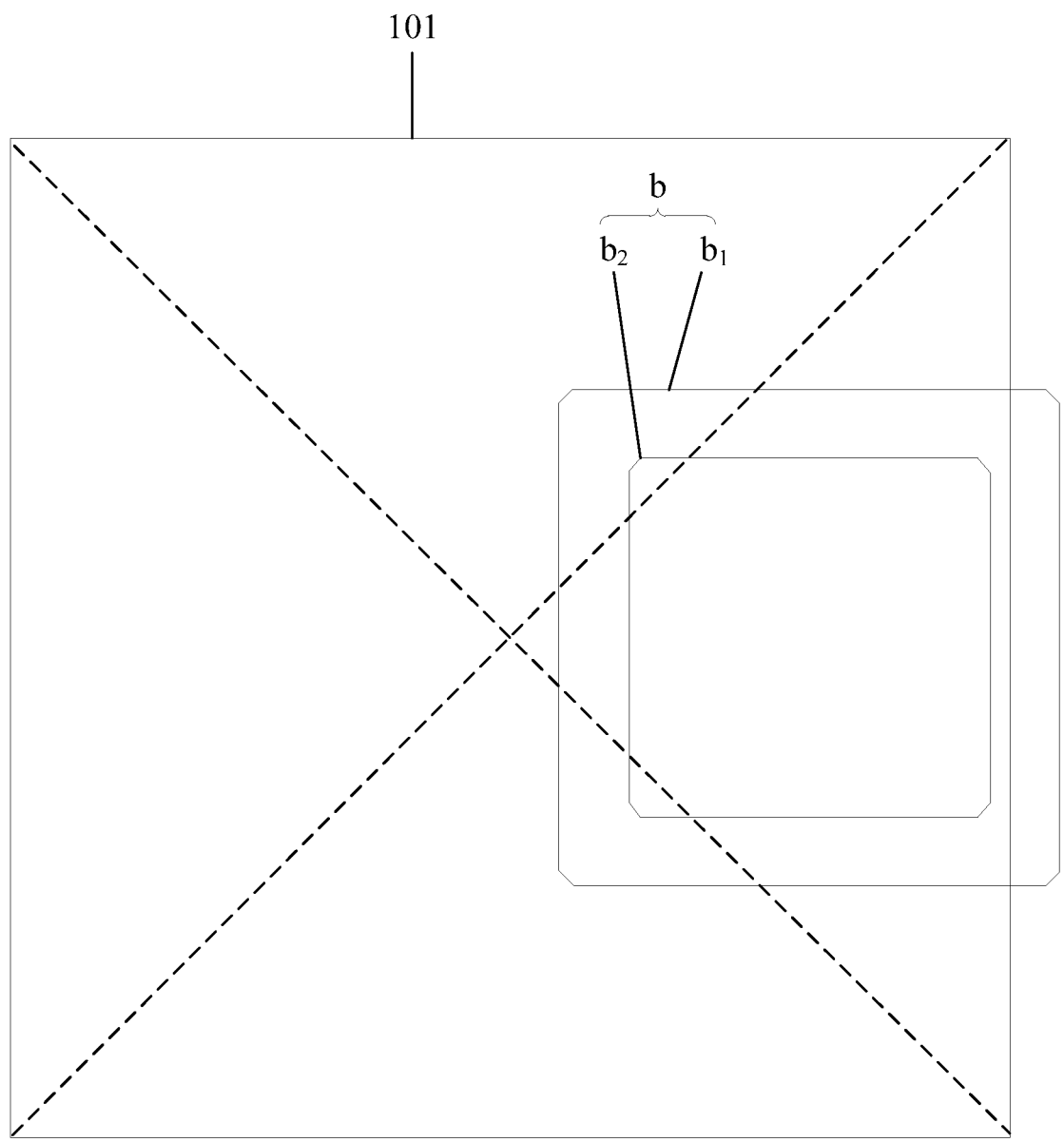
FIG. 13 is a schematic structural diagram of a second insulating layer in FIG. 2.
Figure 19:
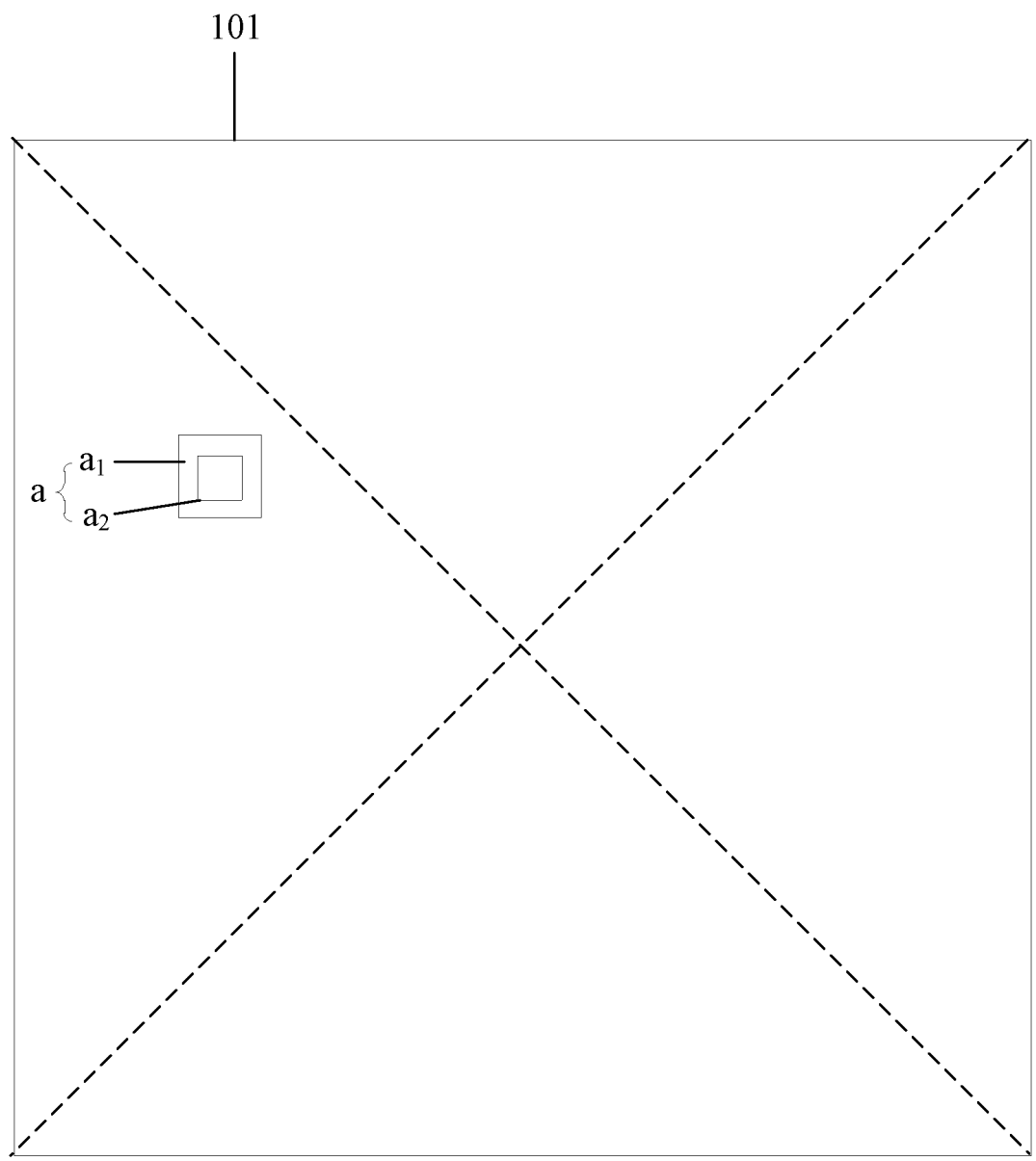
FIG. 19 is a schematic structural diagram of a first insulating layer in FIG. 17.

In some embodiments, in the above detection substrate provided by the embodiments of the present disclosure, as shown in FIG. 3, FIG. 10 and FIG. 19, the first insulating layer 103 may include a first planarization layer 1031 and a first protective layer 1032 stacked. The first through hole a includes a first through sub-hole $a_1$ in the first planarization layer 1031 and a second through sub-hole $a_2$ located in the first protective layer 1032, where the first through sub-hole $a_1$ and the second through sub-hole $a_2$ are arranged through with each other, and an orthographic projection of the second through sub-hole $a_2$ on the base substrate 101 is located in an orthographic projection of the first through sub-hole $a_1$ on the base substrate. In some embodiments, the material of the first planarization layer 1031 may be an organic insulating material, etc., and the material of the first protective layer 1032 may be an inorganic insulating material, etc.

In some embodiments, in the detection substrate provided by the embodiments of the present disclosure, as shown in FIG. 1 and FIG. 16, the pixel regions P which are adjacent to each other in the direction X in which the gate lines extend share the data line DL, and the pixel regions P which are adjacent to each other in a direction Y in which the data lines extend do not share the gate line G. As shown in FIG. 2, FIG. 3, FIG. 14 and FIG. 17, the detection substrate further includes a transparent bias voltage layer 106 on a side of a layer where the photosensitive devices 104 are located facing away from the base substrate 101. The transparent bias voltage layer 106 includes a plurality of first hollow structures $K_1$ extending in a direction which is the same as the direction X in which the plurality of gate lines extend, orthographic projections of the first hollow structures $K_1$ on the base substrate 101 and orthographic projections of the gate lines G on the base substrate have overlapping regions, and a width of the first hollow structure $K_1$ in the direction Y in which the data lines extend is larger than the sum of the widths of two adjacent gate lines G and the distance between the two adjacent gate lines G, so as to minimize the crosstalk between the signals of the gate lines G and the transparent bias voltage layer 106.

Figure 14:
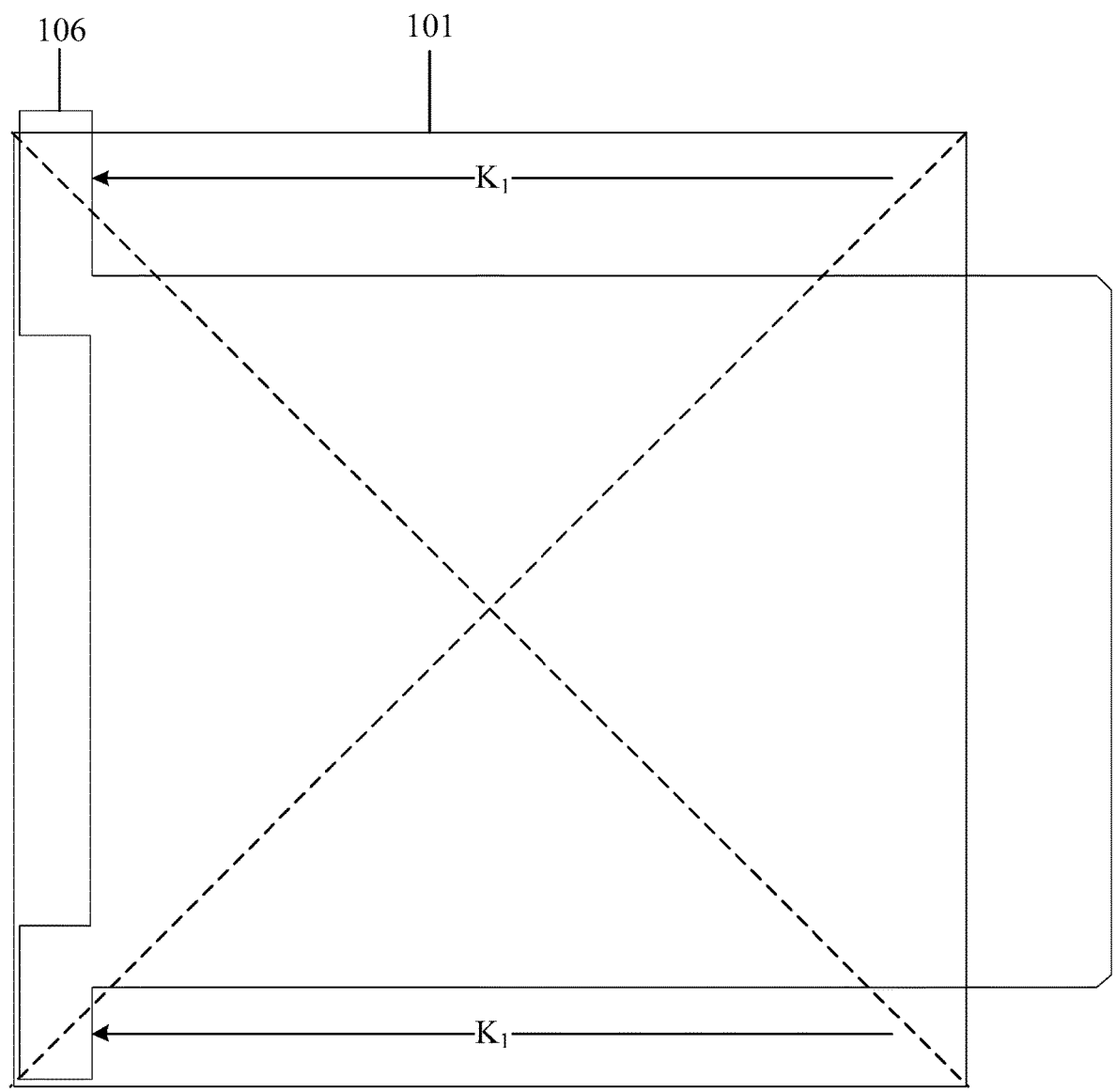
FIG. 14 is a schematic structural diagram of a transparent bias voltage layer in FIG. 2.
Figure 15:
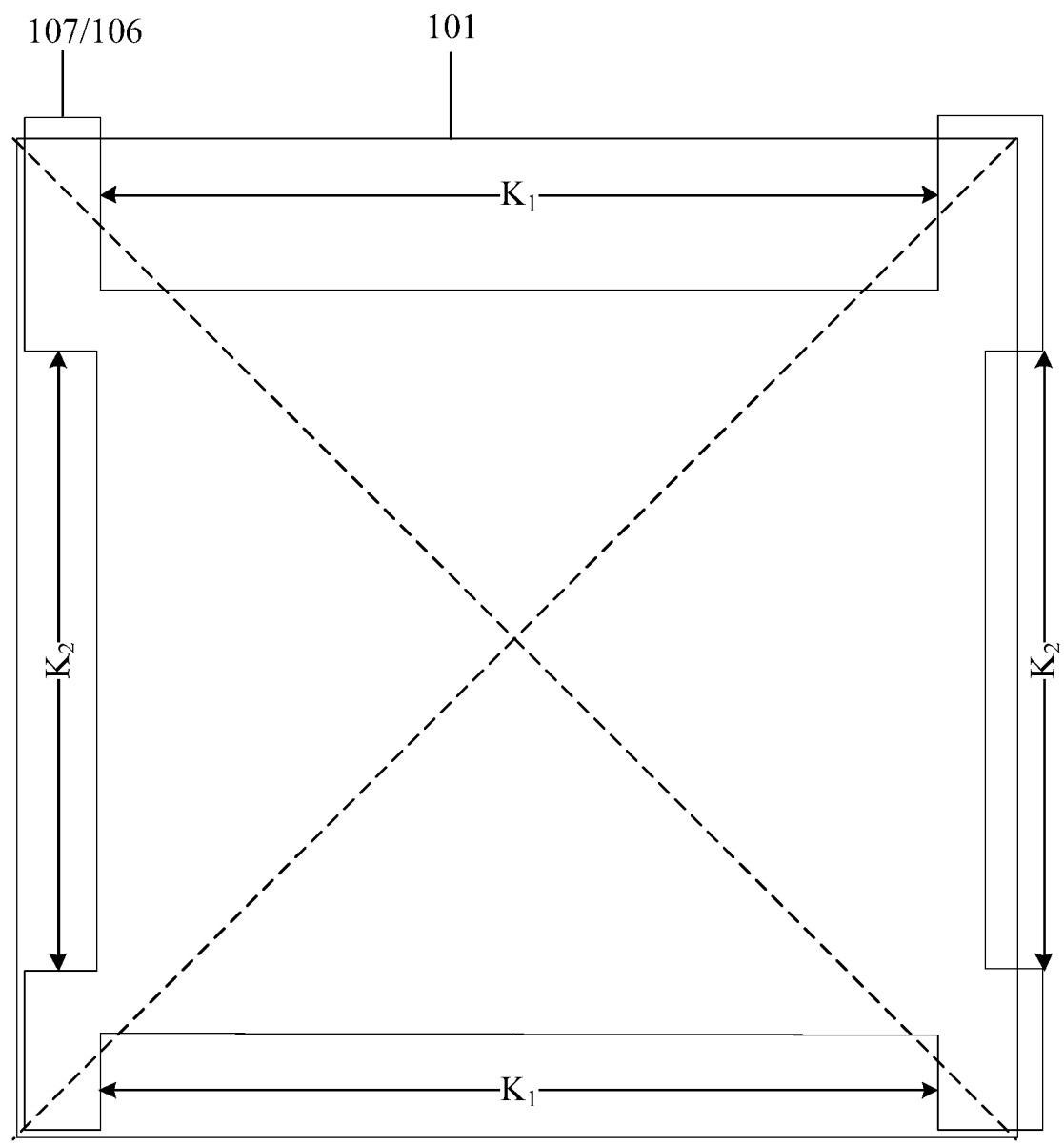
FIG. 15 is a schematic structural diagram of a shielding layer in FIG. 2.

It should be noted that, in the case where the photoelectric conversion layer 1042 extends to a pixel region P which is adjacent to a pixel region P where the photoelectric conversion layer 1042 is located as shown in FIG. 2, for the transparent bias voltage layer 106 on one photosensitive devices 104, as shown in FIG. 14, the transparent bias voltage layer 106 may extend to the adjacent pixel region P to completely cover the photosensitive device 104. For the photosensitive devices 104 which are adjacent to each other in the direction X in which the gate lines extend, as shown in FIG. 1, the transparent bias voltage layer 106 is a whole without hollow patterns. In the case where the first through hole a and the photoelectric conversion layer 1042 are located in the same pixel region P as shown in FIG. 17, in order to minimize the crosstalk between the signals of the data lines DL and the transparent bias voltage layer 106, as shown in FIG. 15, the transparent bias voltage layer 106 may also include a plurality of second hollow structures $K_2$ in a direction which is the same as the direction Y in which the data lines extend, orthographic projections of the second hollow structures $K_2$ on the base substrate 101 and orthographic projections of the data lines DL on the base substrate have overlapping regions, and a width of the second hollow structure $K_2$ in the direction X in which the gate lines extend is larger than a line width of the data line DL.

In some embodiments, as shown in FIG. 2, FIG. 3, FIG. 15 and FIG. 17, the detection substrate may further include a shielding layer 107 that is located on a side of the transparent bias voltage layer 106 away from the base substrate 101 and is insulated from the transparent bias voltage layer 106. The shielding layer 107 can play the role of electrostatic protection. In specific implementation, the shielding layer 107 can be grounded. In order to improve the crosstalk among the signals of the gate lines G, the data lines DL and the shielding layer 107, the positions in the shielding layer 107 that are directly opposite to the first hollow structures $K_1$ and the second hollow structures $K_1$ can be hollowed out, that is, the shielding layer 107 may have a structure shown in FIG. 15. In addition, it can be seen from FIG. 3 that the photoelectric conversion layer 1042 is stacked on the first insulating layer 103 without passing through the region where the first through hole a is located, which ensures the high flatness of the photoelectric conversion layer 1042. The second planarization layer 1081 above the photoelectric conversion layer 1042 fills up to flat the first through hole a, which improves the overall flatness of the mutually insulated transparent bias voltage layer 106 and shielding layer 107 formed in the subsequent three processes, and can effectively avoid the thin transparent bias voltage layer 106 to break.

In some embodiments, in the above-mentioned detection substrate provided by the embodiments of the present disclosure, as described in FIG. 2, FIG. 3, FIG. 13, FIG. 17 and FIG. 22, the detection may further includes a second insulating layer 108 between the layer where the plurality of photosensitive devices 104 are located and the transparent bias voltage layer 106. The second insulating layer 108 includes a plurality of second through holes b. An orthographic projection of the transparent bias voltage layer 106 on the base substrate 101 completely covers an orthographic projection of the plurality of second through holes b on the base substrate, and the transparent bias voltage layer 106 is electrically connected with the second electrode 1043 through the second through hole b. In some embodiments, the second insulating layer 108 includes a second planarization layer 1081 and a second protective layer 1082 stacked. Each of the second through hole b includes a third through sub-hole $b_1$ in the second planarization layer 1081 and a fourth through sub-hole $b_2$ in the second protective layer 1082, where the third through sub-hole $b_1$ and the fourth through sub-hole $b_2$ are arranged through with each other, and an orthographic projection of the fourth through sub-hole $b_2$ on the base substrate 101 is located in an orthographic projection of the third through sub-hole $b_1$ on the base substrate. In some embodiments, the material of the second planarization layer 1081 may be an organic insulating material, etc., and the material of the second protective layer 1082 may be an inorganic insulating material, etc.

In some embodiments, in the above detection substrate provided by the embodiments of the present disclosure, as shown in FIG. 12, FIG. 13, FIG. 21 and FIG. 22, in order to realize a good electrical connection between the transparent bias voltage layer 106 and the second electrode 1043, shapes of orthographic projections of the third through hole $b_1$, the fourth through hole $b_2$, and the second electrode 1043 on the base substrate 101 may all be the same as a shape of the orthographic projection of the photoelectric conversion layer 1042 on the base substrate.

In some embodiments, in the above detection substrate provided by the embodiments of the present disclosure, as shown in FIG. 11 to FIG. 13 and FIG. 20 to FIG. 22, shapes of the orthographic projections of the photoelectric conversion layer 1042, the main portion 411, the protrusion portion 412, and the second electrode 1043 on the base substrate 101 are all square, so as to facilitate production.

In some embodiments, as shown in FIG. 3, the detection substrate may further includes a gate electrode insulating layer 109, an interlayer dielectric layer 110, an inorganic insulating layer 111, a buffer layer 112 and the like. Those of ordinary skill in the art should understand other essential components in the detection substrate, and will not be repeated here, nor should they be used as limitations on the present disclosure.

Based on the same inventive concept, an embodiment of the present disclosure provides a detection apparatus, including the above-mentioned detection substrate provided by the embodiment of the present disclosure. Since the problem-solving principle of the detection apparatus is similar to the problem-solving principle of the above-mentioned detection substrate, the implementation of the detection apparatus can refer to the above-mentioned embodiment of the detection substrate, and the repetition will not be repeated.

In some embodiments, the detection apparatus provided by the embodiments of the present disclosure may be used for identifying fingerprint, palm-print, and other lines, or for X-ray detection and imaging. In addition, other essential components in the detection apparatus should be understood by those of ordinary skill in the art, and will not be repeated here, nor should they be used as limitations on the present disclosure.

Although the preferred embodiments of the present disclosure have been described, those skilled in the art can make various changes and modifications to the embodiments of the present disclosure without departing from the spirit and scope of the embodiments of the present disclosure. In this way, if these modifications and variations of the embodiments of the present disclosure fall within the scope of the claims of the present disclosure and their equivalent technologies, the present disclosure also intends to include these modifications and variations.

What is claimed is:

1. A detection substrate, comprising:
a base substrate;
a plurality of pixel drive circuits on the base substrate;
a first insulating layer on a side of a layer where the plurality of pixel drive circuits are located facing away from the base substrate, wherein the first insulating layer comprises a plurality of first through holes; and
a plurality of photosensitive devices on a side of the first insulating layer facing away from the layer where the plurality of pixel drive circuits are located;
wherein each of the plurality of photosensitive devices comprises a first electrode, a photoelectric conversion layer and a second electrode stacked;
the first electrode comprises a main portion carrying the photoelectric conversion layer and a protrusion portion extending from one side of the main portion to cover a first through hole;
the protrusion portion is electrically connected with the pixel drive circuit through the first through hole; and
an orthographic projection of the photoelectric conversion layer on the base substrate and an orthographic projection of the first through hole on the base substrate are arranged side by side;
wherein the detection substrate further comprises: a plurality of gate lines and a plurality of data lines, wherein the plurality of gate lines and the plurality of data lines intersect to define a plurality of pixel regions;
wherein the pixel drive circuit comprises a read transistor electrically connected with one of the plurality of gate lines and one of the plurality of data lines, respectively; and
the orthographic projection of the photoelectric conversion layer on the base substrate partially overlaps with an orthographic projection of a first terminal of the read transistor, which is in the adjacent pixel region, on the base substrate;
wherein the first terminal of the read transistor is electrically connected with the data line.

2. The detection substrate according to claim 1, wherein each of the pixel regions is arranged one-to-one corresponding with the first through hole; and one pixel drive circuit and one photosensitive device are electrically connected through the first through hole, and the orthographic projection of the first through hole on the base substrate and the orthographic projection of the photoelectric conversion layer on the base substrate are arranged side by side in a direction of the plurality of gate lines extension.

3. The detection substrate according to claim 2, wherein the orthographic projection of the first through hole on the base substrate is in a pixel region corresponding to the first through hole; and the orthographic projection of the photoelectric conversion layer on the base substrate extends into an adjacent pixel region in the direction of the plurality of gate lines extension; or
the orthographic projection of the first through hole on the base substrate and the orthographic projection of the photoelectric conversion layer on the base substrate are arranged side by side.

4. The detection substrate according to claim 1, wherein an orthographic projection of an extension line of a side edge of the main portion away from the protrusion portion on the base substrate substantially coincides with an orthographic projection of an edge of a gate electrode of the read transistor, which is in the adjacent pixel region and close to the main portion, on the base substrate.

5. The detection substrate according to claim 1, wherein the pixel drive circuit further comprises an amplifying transistor, and the amplifying transistor is electrically connected with the read transistor and the first electrode respectively;
   an orthographic projection of the amplifying transistor on the base substrate is on a side of the read transistor away from the data line with which the read transistor is electrically connected; and
   the orthographic projection of the photoelectric conversion layer on the base substrate partially overlaps with an orthographic projection of a gate electrode of the amplifying transistor, which is in a same pixel region as the photoelectric conversion layer, on the base substrate.

6. The detection substrate according to claim 5, wherein in the same pixel region, the orthographic projection of the first through hole on the base substrate is at a diagonal line, away from the read transistor, of the pixel region.

7. The detection substrate according to claim 6, wherein the read transistor comprises two gate electrodes; and
   in a same pixel region, an orthographic projection of an extension line of a side edge of the protrusion portion away from the main portion on the base substrate is between the two gate electrodes of the read transistor.

8. The detection substrate according to claim 7, wherein an orthographic projection of a boundary line between the main portion and the protrusion portion on the base substrate and an orthographic projection of the gate electrode of the amplifying transistor on the base substrate have an overlapping area; and
   an overlapping width of the orthographic projection of the main portion on the base substrate and the orthographic projection of the gate electrode of the amplifying transistor on the base substrate in the direction of the plurality of gate lines extension, is larger than an overlapping width of the orthographic projection of the photoelectric conversion layer on the base substrate and the orthographic projection of the gate electrode of the amplifying transistor on the base substrate in the direction of the plurality of gate lines extension.

9. The detection substrate according to claim 5, wherein the pixel drive circuit further comprises a connection electrode and a reset transistor, wherein the reset transistor is electrically connected with the amplifying transistor through the connection electrode; and
   an orthographic projection of a connection position between the connection electrode and the reset transistor on the base substrate is on a side of the first through hole away from the photoelectric conversion layer.

10. The detection substrate according to claim 3, further comprising: a plurality of power supply lines extending in a same direction as the data lines;
   wherein the power supply line is electrically connected with the pixel drive circuit;
   the power supply line is adjacent to a data line electrically connected with a pixel drive circuit in an adjacent pixel region;
   the orthographic projection of the photoelectric conversion layer on the base substrate and an orthographic projection of the power supply line on the base substrate have an overlapping area; and
   the orthographic projection of the photoelectric conversion layer on the base substrate does not overlap with an orthographic projection of the data line, which is electrically connected with the pixel drive circuit in the adjacent pixel region, on the base substrate.

11. The detection substrate according to claim 10, wherein an orthographic projection of the main portion on the base substrate partially overlaps with the orthographic projection of the data line, which is electrically connected with the pixel drive circuit in the adjacent pixel region, on the base substrate.

12. The detection substrate according to claim 10, wherein the pixel drive circuit comprises a read transistor electrically connected with one of the plurality of gate lines and one of the plurality of data lines, respectively; and an amplifying transistor electrically connected with the read transistor, the first electrode and the power supply line, respectively;
   an orthographic projection of the amplifying transistor on the base substrate is on a side of the read transistor away from the data line with which the read transistor is electrically connected; and
   an orthographic projection of an extension line of a side edge of the photoelectric conversion layer adjacent to the protruding portion on the base substrate is between the read transistor and the amplifying transistor.

13. The detection substrate according to claim 12, wherein in a same pixel region, the orthographic projection of the first through hole on the base substrate is in a region enclosed by the data line, a diagonal line of the pixel region and the read transistor; or
   wherein the pixel drive circuit further comprises a connection electrode and a reset transistor, wherein the reset transistor is electrically connected with the amplifying transistor through the connection electrode; and
   an orthographic projection of a connection position between the connection electrode and the reset transistor on the base substrate is on a side of the first through hole close to the photoelectric conversion layer.

14. The detection substrate according to claim 13, wherein in a same pixel region, an orthographic projection of an extension line of a side edge of the protrusion portion away from the main part on the base substrate and an orthographic projection of a first terminal of the read transistor on the base substrate have an overlapping region, and the first terminal of the read transistor is electrically connected with the data line.

15. The detection substrate according to claim 11, wherein in a same pixel region, an orthographic projection of a boundary line between the main portion and the protrusion portion on the base substrate substantially coincides with an edge, which is adjacent to the amplifying transistor, of a gate electrode of the read transistor.

16. The detection substrate according to claim 1, wherein the first insulating layer comprises a first planarization layer and a first protective layer stacked; and
   the first through hole comprises a first through sub-hole in the first planarization layer, and a second through sub-hole in the first protective layer, wherein the first through sub-hole and the second through sub-hole are arranged through with each other, and an orthographic projection of the second through sub-hole on the base substrate is located in an orthographic projection of the first through sub-holes on the base substrate.

17. The detection substrate according to claim 2, wherein in the direction of the plurality of gate lines extension, pixel regions which are adjacent to each other share a data line; and in a direction of the plurality of data lines extension, pixel regions which are adjacent to each other do not share a gate line; the detection substrate further comprises a transparent bias voltage layer on a side of a layer where the plurality of photosensitive devices are located facing away from the base substrate; and the transparent bias voltage layer comprises a plurality of first hollow structures extending in a direction same as the direction of the plurality of gate lines extension; orthographic projections of the first hollow structures on the base substrate and orthographic projections of the plurality of gate lines on the base substrate have overlapping regions; and a width of a first hollow structures in a direction of the plurality of data lines extension is larger than a sum of widths of two adjacent gate lines and a distance between the adjacent two gate lines; or wherein the detection substrate further comprises: a transparent bias voltage layer on a side of a layer where the plurality of photosensitive devices are located facing away from the base substrate; and the transparent bias voltage layer comprises a plurality of second hollow structures extending in a direction same as a direction of the plurality of data lines extension; orthographic projections of the second hollow structures on the base substrate and orthographic projections of the plurality of data lines on the base substrate have overlapping regions; and a width of a second hollow structure in the direction of the plurality of gate lines extension is larger than a line width of the data line.

18. The detection substrate according to claim 17, further comprising: a second insulating layer between the layer where the plurality of photosensitive devices are located and the transparent bias voltage layer, and the second insulating layer comprises a plurality of second through holes; and an orthographic projection of the transparent bias voltage layer on the base substrate completely covers an orthographic projection of the plurality of second through holes on the base substrate; and the transparent bias voltage layer is electrically connected with the plurality of second electrode through the plurality of second through holes;

wherein the second insulating layer comprises a second planarization layer and a second protective layer stacked; and each of the plurality of second through holes comprises a third through sub-hole in the second planarization layer, and a fourth through sub-hole in the second protective layer; wherein the third through sub-hole and the fourth through sub-hole are arranged through with each other, and an orthographic projection of the fourth through sub-hole on the base substrate is located in an orthographic projection of the third through sub-hole on the base substrate.

19. A detection apparatus, comprising the detection substrate according to claim 1.

* * * * *